US010825209B2

(12) United States Patent
Dempsey et al.

(10) Patent No.: US 10,825,209 B2
(45) Date of Patent: *Nov. 3, 2020

(54) SYSTEM AND METHOD FOR PERFORMING TOMOGRAPHIC IMAGE ACQUISITION AND RECONSTRUCTION

(71) Applicant: ViewRay Technologies, Inc., Oakwood Village, OH (US)

(72) Inventors: James F. Dempsey, Atherton, CA (US); Qingguo Zeng, Twinsburg, OH (US); Roger Nana, Oakwood Village, OH (US); John Lester Patrick, Chagrin Falls, OH (US); Timothy P. Eagan, Oakwood Village, OH (US); Shmaryu M. Shvartsman, Highland Heights, OH (US)

(73) Assignee: VIEWRAY TECHNOLOGIES, INC., Oakwood Village, OH (US)

(*) Notice: Subject to any disclaimer, the term of this patent is extended or adjusted under 35 U.S.C. 154(b) by 57 days.

This patent is subject to a terminal disclaimer.

(21) Appl. No.: 16/105,848

(22) Filed: Aug. 20, 2018

(65) Prior Publication Data

US 2019/0012814 A1  Jan. 10, 2019

Related U.S. Application Data

(63) Continuation of application No. 15/294,533, filed on Oct. 14, 2016, now Pat. No. 10,055,861, which is a (Continued)

(51) Int. Cl.
*G06T 11/00* (2006.01)
*G01R 33/48* (2006.01)
(Continued)

(52) U.S. Cl.
CPC ........ *G06T 11/006* (2013.01); *G01R 33/4826* (2013.01); *G01R 33/5608* (2013.01);
(Continued)

(58) Field of Classification Search
CPC ........... A61B 5/00; A61B 6/00; G06T 11/006; G06T 7/0012; G06T 2211/424; G01R 33/4826; G01R 33/5608; G01R 33/5611
(Continued)

(56) References Cited

U.S. PATENT DOCUMENTS 6,005,916 A   12/1999  Johnson
6,636,645 B1  10/2003  Yu
(Continued)

FOREIGN PATENT DOCUMENTS

CN   101273892   10/2008
CN   101320468   12/2008
(Continued)

OTHER PUBLICATIONS

Trzasko et al. (Highly Undersampled Magnetic Resonance Image Reconstruction vai Homotopic L0—Minimization, IEEE Transactions on Medical Imaging, Jul. 2, 2008, pp. 1-16). Article previously submitted by Applicant via IDS.
(Continued)

*Primary Examiner* — Ali Bayat
(74) *Attorney, Agent, or Firm* — Pillsbury Winthrop Shaw Pittman LLP

(57) ABSTRACT

Systems and methods for tomographic reconstruction of an image include systems and methods for producing images from k-space data. A k-space data set of an imaged object is acquired using know k-space data acquisition systems and methods. A portion of the k-space data set is sampled so as to collect some portion of the k-space data. An image is then
(Continued)

reconstructed from the collected portion of the k-space data set according to a convex optimization model.

19 Claims, 21 Drawing Sheets

Related U.S. Application Data continuation of application No. 12/817,846, filed on Jun. 17, 2010, now Pat. No. 9,472,000.

(60) Provisional application No. 61/218,736, filed on Jun. 19, 2009.

(51) Int. Cl.
  *G01R 33/56* (2006.01)
  *G01R 33/561* (2006.01)
  *G06T 7/00* (2017.01)

(52) U.S. Cl.
  CPC ........ *G01R 33/5611* (2013.01); *G06T 7/0012* (2013.01); *G06T 2211/424* (2013.01)

(58) Field of Classification Search
  USPC .......................................................... 382/131
  See application file for complete search history.

(56) References Cited

U.S. PATENT DOCUMENTS

| | | | |
|---|---|---|---|
| 7,092,573 | B2 | 8/2006 | Luo |
| 7,202,663 | B2 | 4/2007 | Huang |
| 7,230,429 | B1 | 6/2007 | Huang |
| 7,265,545 | B2 | 9/2007 | Krueger |
| 7,460,637 | B2 * | 12/2008 | Clinthorne ............... A61B 6/14 378/17 |
| 7,486,839 | B2 | 2/2009 | Moriguchi |
| 7,532,705 | B2 | 5/2009 | Yin |
| 7,542,622 | B1 | 6/2009 | Angelini |
| 7,659,718 | B1 | 2/2010 | Lustig |
| 7,791,338 | B2 | 9/2010 | Kim |
| 7,840,045 | B2 | 11/2010 | Guo |
| 8,155,417 | B2 | 4/2012 | Piron |
| 8,310,233 | B2 | 11/2012 | Trzasko |
| 9,472,000 | B2 | 10/2016 | Dempsey |
| 2003/0068097 | A1 | 4/2003 | Wilson |
| 2003/0155530 | A1 | 8/2003 | Adnani |
| 2004/0054248 | A1 | 3/2004 | Kimchy |
| 2005/0197564 | A1 | 9/2005 | Dempsey |
| 2005/0207531 | A1 | 9/2005 | Dempsey |
| 2006/0079754 | A1 | 4/2006 | Welch |
| 2006/0120583 | A1 | 6/2006 | Dewaele |
| 2007/0083114 | A1 | 4/2007 | Yang |
| 2007/0159174 | A1 | 7/2007 | Oshio |
| 2007/0230770 | A1 | 10/2007 | Kulkarni |
| 2008/0197842 | A1 | 8/2008 | Lustig |
| 2009/0039886 | A1 | 2/2009 | White |
| 2009/0240135 | A1 | 9/2009 | Gleich |
| 2010/0312100 | A1 | 12/2010 | Zarkh |
| 2010/0322497 | A1 | 12/2010 | Dempsey |
| 2011/0285960 | A1 | 11/2011 | Kohn |
| 2012/0197102 | A1 | 8/2012 | Hanebuchi |
| 2012/0245453 | A1 | 9/2012 | Tryggestad |
| 2013/0090549 | A1 | 4/2013 | Meltsner |
| 2013/0261429 | A1 | 10/2013 | Lee |
| 2013/0345545 | A1 | 12/2013 | Gross |
| 2016/0232690 | A1 | 8/2016 | Ahmad |
| 2016/0324664 | A1 | 11/2016 | Piron |
| 2016/0334479 | A1 | 11/2016 | Poole |
| 2017/0032544 | A1 | 2/2017 | Dempsey |
| 2017/0371001 | A1 | 12/2017 | Dempsey |

FOREIGN PATENT DOCUMENTS

| | | |
|---|---|---|
| CN | 101455565 | 6/2009 |
| EP | 2327993 | 6/2011 |
| WO | 2003008986 A2 | 1/2003 |
| WO | 2015138945 | 9/2015 |

OTHER PUBLICATIONS

Lustig, M, et. al. 'Faster Imaging with Randomly Perturbed, Undersampled Spirals and |L|_1 Reconstruction.' In: Proceedings of the 13th Annual Meeting of ISMRM, Miami Beach, 2005. (1 page).

PCT App. No. PCT/US2010/039036; International Search Report dated Aug. 11, 2010; (pp. 1-2).

Meyer, et al. "Fast Spiral Coronary Artery Imaging", Magnetic Resonance in Medicine 28, pp. 202-213 (1992).

CIPRA 'L1-magic' from SIAM News, vol. 39, No. 9, Nov. 2006. (3 pages).

Candes, et al. 'Robust Uncertainty Principles: Exact Signal Reconstruction from Highly Incomplete Frequency Information.' IEEE Transactions on Information Theory, vol. 52, No. 2, Feb. 2006, pp. 489-509.

Donoho, 'Compressed Sensing'. Sep. 14, 2004. (34 pages).

Yang, Junfeng, et. al. 'A Fast TVL1-L2 Minimization Algorithm for Signal Reconstruction from Rartial Fourier Data.' Technical Report, TR08-27, CAAM, Rice University Houston, TX, 2008. pp. 1-10.

Trzasko et al. 'Highly Undersampled Magnetic Resonance Image Reconstruction via Homotopic L0—Minimization' IEEE Transactions on Medical Imaging. vol. 28. No. 1. Jan. 31, 2009, pp. 106-121.

Blaimer, et al. 'Smash, Sense, Pills, Grappa, How to Choose the Optimal Method'. Top Magan Reson Imaging, vol. 15, No. 4, Aug. 2004, pp. 223-236.

Irarrazabal, Pablo, and Dwight G. Nishimura. 'Fast Three Dimensional Magnetic Resonance Imaging.' Magnetic Resonance in Medicine, vol. 33, No. 5, 1995, pp. 656-662.

Candes, et al. 'Sparsity and Incoherence in Compressive Sampling' Nov. 2006, pp. 1-20.

Lustig, et al. 'L1 SPIR-IT: Autocalibrating Parallel Imaging Compressed Sensing.' (1 page).

Riek, Jonathan K, et. al. 'Flow Compensation in MRI Using a Phase-Corrected Real Reconstruction.' Magnetic Resonance in Medicine, vol. 30, No. 6, 1993, pp. 724-731.

Bilgin, A. et al. 'Randomly Perturbed Radial Trajectories for Compressed Sensing MRI.' Proceedings of International Society for Magnetic Resonance in Medicine 16 (2008):3152.

Hernando, D. et al. 'Interventional MRI with sparse sampling: an application of compressed sensing.' Proceedings of International Society for Magnetic Resonance in Medicine.16 (2008): 1482.

Law, C. , and Glover, G. 'Deconvolving Haemodynamic Response Function in fMRI under high noise by Compressive Sampling.' Proceedings of International Society for Magnetic Resonance in Medicine. 17 (2009): 1712.

Li, Kang and Kanadae, Takeo. 'Nonnegative Mixed-Norm Preconditioning for Microscopy Image Segmentation.' Information Processing in Medical Imaging. Springer Berlin Heidelberg. vol. 5636. (2009):362-373.

Lagendijk JJ W et al.: "MRI Guided Radiotherapy: A MRI based linear Accelerator", Radiotherapy and Oncology, vol. 56, No. 01, Sep. 21, 2000 (Sep. 21, 2000), pp. S60-S61.

Haacke E M et al. 'Constrained reconstruction: A superresolution, optimal signal-to-noise alternative to the Fourier transform in magnetic resonance imaging.' Medical Physics, AIP, Melville, NY, US, vol. 16, No. 3, May 1, 1989 (May 1, 1989), pp. 388-397, XP000034068, ISSN: 0094-2405, DDI: 10.1118/1.596427.

Roullot E et al. 'Regularized reconstruction of 3D high-resolution magnetic resonance images from acquisitions of anisotropically degraded resolutions.' Pattern Recognition, 2000. Proceedings. 15th International Conference on Sep. 3-7, 2000; [Proceedings of the

(56) References Cited

OTHER PUBLICATIONS

International Conference on Pattern Recognition. (ICPR)], Los Alamitos, CA, USA,IEEE Comput. Soc, US, vol. 3, Sep. 3, 2000 (Sep. 3, 2000), pp. 346-349.

Foroosh, Hassan, et.al. 'Extension of Phase Correlation to Subpixel Registration.' IEEE Transactions on Image Processing, vol. 11, No. 3, 2002, pp. 188-200.

Gerganov G et al, 'Portal image registration using the phase correlation method', 2013 IEEE Nuclear Science Symposium and Medical Imaging Conference (2013 NSS/MIC), IEEE, (Oct. 27, 2013), doi:10.1109/NSSMIC.2013.6829306, pp. 1-3, XP032601397.

Reddy, B. Srinivas, and B. N. Chatterji. 'An FFT-Based Technique for Translation, Rotation, and Scale-Invariant Image Registration.' IEEE Transactions on Image Processing, vol. 5, No. 8, Aug. 1996, pp. 1266-1271.

Riek, et al. "Flow Compensation in MRI Using a Phase-Corrected Real Reconstruction", Magnetic Resonance in Medicine 30, pp. 724-731, 1993.

Tamada and Kose. 'Two-Dimensional Compressed Sensing Using the Cross-sampling Approach for Low-Field MRI Systems.' IEEE Transactions on Medical Imaging. vol. 33, No. 9. Sep. 2014. pp. 1905-1912.

Zitova B et al, 'Image Registration Methods: A Survey', Image and Vision Computing, Elsevier, Guildford, GB, (Oct. 1, 2003), vol. 21, No. 11, doi:10.1016/S0262-8856(03)00137-9, ISSN 0262-8856, pp. 977-1000, XP001189327.

Yoon et al. "Accuracy of an Automatic Patient-Positioning System Basedon the Correlation of Two Edge Images in Radiotherapy", Journal of Digital Imaging, vol. 24, No. 2 (Apr. 2011: pp. 322-330).

Lustig, M, et. al. "L1 SPIR-iT: Autocalibrating Parallel Imaging Compressed Sensing." In: Proceedings of the Seventeenth Meeting of the International Society for Magnetic Resonance in Medicine. Berkeley, Calif: International Society for Magnetic Resonance in Medicine, 2009 pp. 334.

Barth, et al. "Simultaneous Multislice (SMS) Imaging Techniques." Magnetic Resonance in Medicine; vol. 75; pp. 63-81; 2016.

PCT App. No. PCT/US2017/038520; International Search Report and Written Opinion dated Oct. 4, 2017; (pp. 1-16).

Kolbitsch, C. et al; "Image-based Self-navigator Using Cardiac Functional Parameters for Cine Imaging"; Proceeding of the International Society for Magnetic Resonance in Medincine, 20th Annual Meeting & Exhibition; May 5, 2010; p. 602; KP040623030; Maelbourne, Australia.

Smolikova, R. et al.; "Registration of Fast Cine Cardiac MR Slices to 3D Procedural Images: Toward Real Time Registration for MRI-guided Procedures"; Proceedings of SPIE, Medical Imaging 2004; vol. 5370 II; Feb. 16, 2004; pp. 1195-1205; XP040181910; San Diego, CA.

Kolbitsch, C. et al; "Cardiac Function Asssesment Without ECG Using Image-based Navigation"; Proceeding of the International Society for Magnetic Resonance in Medincine, 20th Annual Meeting & Exhibition; May 5, 2010; p. 3849; KP040626270; Maelbourne, Australia.

Paganelli Chiara et al; Liver 4DMRI: A Retrospective Image-based Sorting Method, Medical Physics, AIP; Melville, NY, US; vol. 42; No. 8; Jul. 24, 2015; pp. 4814-4821; XP012199252; ISSN: 0094-2405; DOI: 10.1118/1.4927252 (Retrieved on Jan. 1, 1901); Section 2.B.

Office Action dated Dec. 6, 2017 for U.S. Appl. No. 15/294,533 (pp. 1-7).

Notice of Allowance dated Apr. 19, 2018 for U.S. Appl. No. 15/294,533 (pp. 1-8).

PCT App. No. PCT/US2017/038867; International Search Report and Written Opinion dated Nov. 8, 2017; (pp. 1-12).

Weaver, John B.; "Simultaneous Multislice Acquisition of MR Images", Magnetic Resonance in Medicine, John Wiley & Sons, Inc., vol. 8, No. 3, Nov. 1, 1988, pp. 275-284, XP000003030, ISSN: 0740-3194.

Jan J. W. Lagendijk et al.; "MR Guidance in Radiotherapy", Physics in Medicine and Biology, Institute of Physics Publishing, Bristol GB, vol. 59, No. 21, Oct. 16, 2014, pp. R349-R369, XP020272054, ISSN: 0031-9155.

B W Raaymakers et al.; "Integrating a 1.5 T MRI Scanner with a 6 MV Accelerator: Proof of Concepts," Physics in Medicine and Biology. vol. 54, No. 12, May 19, 2009, pp. N229-N237, XP055395399, Bristol GB ISSN: 0031-9155.

Zaitsev M et al.: "Shared k-space Echo Planar Imaging with Keyhole," Magnetic Resonance in Medicine, John Wiley & Sons, Inc. US, vol. 45, Jan. 1, 2001, pp. 109-117, XP002311925, ISSN: 0740-3194.

Von, Siebenthal M. et al; "4D MR Imaging of Respiratory Organ Motion and its Variability; 4D MRI of Respiratory Organ Motion", Physics in Medicine and Biology, Instititute of Physics Publishing, Bristol GB, vol. 52, No. 6, Mar. 21, 2007, pp. 1547-1564, XP20113239, ISSN: 0031-9155, DOI: 10.1088/0031-9155/52/6/001, pp. 1547-1553.

Buerger et al. "3D Non-Rigid Motion Modeling of the Liver from Undersampled Golden-Radial Phase Encoding (G-RPE) Acquisitions". Proc. Intl. Soc. Mag. Reson. Med. 19 (2011). p. 643. (Year: 2011).

Kim et al. "Extraction of Cardiac and Respiratory Motion Cycles by Use of Projection Data and Its Applications to NMR Imaging". Magnetic Resonance in Medicine 13,25-37 (1990). (Year: 1990).

Krombach G.A. "MRI Guidance of Vascular Applications". In: Kahn T., Busse H. (eds) Interventional Magnetic Resonance Imaging. Medical Radiology. Springer, Berlin, Heidelberg. (2011) (Year: 2011).

Bhat et al. "3D Radial Sampling and 3D Affine Transform-based Respiratory Motion Correction Technique for Free-breathing Whole-Heart Coronary MRA with 100% Imaging Efficiency". Magn Reson Med. May 2011 ; 65(5): 1269-1277. doi:10.1002/mrm .22717. (Year: 2011).

Lin et al. "Heart deformation analysis: measuring regional myocardial velocity with MR imaging". Int J Cardiovasc Imaging (2016) 32 :1103-1111. DOI 10.1007/s10554-016-0879-z (Year: 2016).

Crijns et al. "Proof of concept of MRI-guided tracked radiation delivery: tracking one-dimensional motion". Phys. Med. Biol. 57 (2012) 7863-7872 doi:10.1088/0031-9155/57/23/7863 (Year: 2012).

International Search Report and Written Opinion, International Application No. PCT/US2018/063108, dated May 10, 2019.

\* cited by examiner

Speed Up = 7.7834

Recon Time = 1.6827 [sec]

a) Original Image b) K-Space Mask Sampling Pattern 23.74% c) $l_0$ Result RelErr: 8.47% d) $l_2$ Result RelErr: 6.78% a) Original Image b) K-Space Mask Sampling Pattern 23.74% c) $l_0$ Result RelErr: 6.62% d) $l_2$ Result RelErr: 5.75% a) Original Image b) K-Space Mask Sampling Pattern 23.74% c) $I_0$ Result RelErr: 8.57% d) $I_2$ Result RelErr: 6.43% a) Original Image b) K-Space Mask Sampling Pattern 23.74% c) $l_0$ Result RelErr: 9.70% d) $l_2$ Result RelErr: 8.30% a) Original Image b) K-Space Mask Sampling Pattern 9.23% c) $l_0$ Result RelErr: 28.58% d) $l_2$ Result RelErr: 10.31% a) Original Image b) K-Space Mask Sampling Pattern 9.23% c) $l_0$ Result RelErr: 45.62% d) $l_2$ Result RelErr: 11.75%

SYSTEM AND METHOD FOR PERFORMING TOMOGRAPHIC IMAGE ACQUISITION AND RECONSTRUCTION

RELATED APPLICATION

This application is a continuation of and claims the benefit of U.S. patent application Ser. No. 15/294,533, filed Oct. 14, 2016, titled "System And Method For Performing Tomographic Image Acquisition And Reconstruction," which is a continuation of U.S. patent application Ser. No. 12/817,846, filed Jun. 17, 2010, now U.S. Pat. No. 9,472,000, titled "System And Method For Performing Tomographic Image Acquisition And Reconstruction," which claims the benefit of U.S. Provisional Application No. 61/218,736, filed Jun. 19, 2009, titled "Process for performing rapid tomographic image acquisition and reconstruction with a priori knowledge and sparse sampling of K-space for real-time imaging applications," the contents of each are hereby incorporated by reference.

BACKGROUND

1. Technical Field

The present application relates to systems and methods for imaging of an object, particularly systems and methods that involve imaging via tomographic reconstruction of measured frequency samples.

2. Related Art

Tomography is imaging by sections or sectioning. A device used in tomography is called a tomograph, while the image produced is a tomogram. Tomography is used in medicine, archaeology, biology, geophysics, oceanography, materials science, astrophysics and other sciences. The word, tomography, was derived from the Greek word tomos which means "a section," "a slice," or "a cutting". While tomography refers to slice-based imaging, it is also typically applied to three-dimensional (3D) images or four-dimensional images (3D images resolved in time).

In 2006, seminal manuscripts from Candes et al. [Emmanuel J. Candès ET AL., Robust uncertainty principles: exact signal reconstruction from highly incomplete frequency information, 52(2) IEEE TRANSACTIONS ON INFORMATION THEORY, 2006, at 489-509] and Donoho [David Donoho, *Compressed sensing*, 52(4) IEEE TRANSACTIONS ON INFORMATION THEORY, April 2006, at 1289-1306] created a new field of research labeled "Compressed Sensing" for the reconstruction of images. In general, as stated in the Donoho manuscript, the theory of Compressed Sensing "depends on one specific assumption which is known to hold in many settings of signal and image processing: the principle of transform sparsity." This has inspired much work that seeks to produce a model that can take advantage of transform sparsity to allow measurement of less data to reconstruct an image, hence speeding up image acquisition. All of these techniques rely on the ability to compress an image itself or some transformation of that image. This body of work is motivated from the seminal manuscript by Donoho where it was stated: "The phenomenon of ubiquitous compressibility raises very natural questions: why go to so much effort to acquire all the data when most of what we get will be thrown away? Can't we just directly measure the part that won't end up being thrown away?" This work has lead to the development of optimization models that are designed to produce transformations that are optimally sparse.

SUMMARY

Systems and methods are disclosed for tomographic reconstruction of an image. For example, according to some aspects of the present disclosure, a method for producing images can comprise acquiring a k-space data set of an imaged object, collecting a portion of the k-space data set, and reconstructing an image from the collected portion of the k-space data set according to a convex optimization model.

The convex optimization model can include a weighting factor representative of expected noise properties within the k-space data set, and a weighting factor representative of a priori attributes of the imaged object.

The collecting of a portion of the k-space data set can include collecting data according to a data collecting pattern. For example, the data collecting pattern can include a spiral pattern, a radial pattern, and/or a pattern comprising a plurality of parallel sampling lines.

In some embodiments, the reconstructing of the image can include generating image data using an approximation of an $l=0$ norm of a discretization of total variation of image intensities. In such embodiments, the generating of the image data can include performing an interactive process, wherein an iteration of the iterative process includes updating a value of a homotopic parameter and updating a value of a quadratic relaxation parameter. Respective values of the homotopic parameter and the quadratic relaxation parameter can be fixed in relation to each other according to a predetermined relationship. Also, an iteration of the iterative process can include increasing the value of the quadratic relaxation parameter according to a predetermined rate, and decreasing the value of the homotopic parameter according to the value of the quadratic relaxation parameter and the predetermined relationship between the quadratic relaxation parameter and the homotopic parameter.

In embodiments that use an $l=0$ norm and that include an iterative process, the iterative process can include inner and outer iterative processes, such that each iteration of the outer iterative process includes one or more iterations of an inner iterative process. Each iteration of the inner iterative process can include updating a value of a relaxation variable based at least in part on the value of the homotopic parameter and the value of the quadratic relaxation parameter. Each iteration of the inner iterative process can also include updating image data based at least in part on the value of the relaxation variable.

In some embodiments, the reconstructing of the image can include generating image data using one of an $l=1$ or $l=2$ norm of a discretization of total variation of image intensities. In such embodiments, the generating of the image data can include performing an interactive process, wherein an iteration of the iterative process can include updating a value of a norm weighting factor to prevent penalizing of discontinuities in the reconstructed image. The norm weighting factor can be based at least in part on a smoothed image data. The updating of the value of the norm weighting factor can include generating the smoothed image data using a Gaussian kernel.

In embodiments that use an $l=1$ or $l=2$ norm and that include an iterative process, the iterative process can include inner and outer iterative processes, such that each iteration of the outer iterative process includes one or more iterations of an inner iterative process. Each iteration of the inner iterative process can include updating a value of a relaxation variable based at least in part on the value of the homotopic parameter and the value of the quadratic relaxation parameter. Also, each iteration of the inner iterative process can include updating image data based at least in part on the value of the relaxation variable.

The reconstructing of the image can include generating image data representative of the imaged object. Also, the reconstructing of the image can include outputting the image data to a display, a printer, and/or a memory device.

According to further aspects of the present disclosure, method for producing images can comprise acquiring a k-space data set of an imaged object, collecting a subset of the k-space data set according to a predetermined data collecting pattern, thereby generating a sampled k-space data set, generating a first set of image data using the sampled k-space data set, and performing an iterative process using the first set of image data to generate a second set of image data. The iterative process can include modifying the first set of image data according to an optimization model that includes combining image data from the first set of image data with k-space data from the sampled k-space data set according to a plurality of weighting factors.

As an example, the first set of image data based at least in part on an inverse Fourier transform of the portion of the k-space data set.

The plurality of weighting factors can include an importance weighting factor for attributes of the image data. The plurality of weighting factors can include a weighting factor for applying a respective weights to different attributes of the image data. The plurality of weighting factors can include a norm weighting factor to prevent penalizing large discontinuities in the image data.

According to still further aspects of the present disclosure, a method for producing images can comprise receiving a k-space data set from a magnetic resonance imaging system, collecting a subset of the k-space data set according to a predetermined data collecting pattern, where the predetermined data collecting pattern includes a spiral pattern, generating a first set of image data using the sampled k-space data set, and performing an iterative process using the first set of image data to generate a second set of image data. The iterative process can include modifying the first set of image data according to an optimization model that includes combining image data from the first set of image data with k-space data from the sampled k-space data set according to a plurality of weighting factors.

The generating of the first set of image data can be based at least in part on an inverse Fourier transform of the portion of the k-space data set.

The plurality of weighting factors can include an importance weighting factor for attributes of the image data. The plurality of weighting factors can include a weighting factor for applying a respective weights to different attributes of the image data. The plurality of weighting factors can include a norm weighting factor to prevent penalizing large discontinuities in the image data.

According to still further aspects of the present disclosure, an imaging system for producing images comprises memory for receiving and storing a k-space data set of an imaged object, and a computing unit for collecting a portion of the k-space data set and reconstructing an image from the collected portion of the k-space data set according to a convex optimization model.

The convex optimization model can include a weighting factor representative of expected noise properties within the k-space data set. The convex optimization model includes a weighting factor representative of a priori attributes of the imaged object.

In some embodiments, the computing unit can generate image data using an approximation of an l=0 norm of a discretization of total variation of image intensities. In such embodiments, the computing unit can generate the image data using an interactive process, wherein an iteration of the iterative process can include updating a value of a homotopic parameter and updating a value of a quadratic relaxation parameter. Respective values of the homotopic parameter and the quadratic relaxation parameter can be fixed in relation to each other according to a predetermined relationship.

In some embodiments, the computing unit can generate the image data using one of an l=1 or l=2 norm of a discretization of total variation of image intensities. In such embodiments, the computing unit can generates the image data using an interactive process, wherein an iteration of the iterative process can include updating a value of a norm weighting factor to prevent penalizing of discontinuities in the reconstructed image. The norm weighting factor can be based at least in part on a smoothed image data.

The computing unit can generate image data representative of the imaged object. The computing unit can output the image data to a display, a printer, and/or a memory device.

The k-space data set can generated by an image capturing system, for example a magnetic resonance imaging (MRI) system or other know image capturing system.

According to still further aspects of the present disclosure, an imaging system for producing images can comprise memory for receiving and storing a k-space data set of an imaged object, and a computing unit for collecting a subset of the k-space data set according to a predetermined data collecting pattern, thereby generating a sampled k-space data set, generating a first set of image data using the sampled k-space data set, and performing an iterative process using the first set of image data to generate a second set of image data. The iterative process can include modifying the first set of image data according to an optimization model that includes combining image data from the first set of image data with k-space data from the sampled k-space data set according to a plurality of weighting factors.

In some embodiments, the imaging system can include an interface for receiving the k-space data set from an image capturing system. In some embodiments, the imaging system can include an integrated image capturing system.

In some embodiments, the predetermined data collecting pattern can include a spiral pattern. In such embodiments, the k-space data set can include k-space data that was generated by a magnetic resonance imaging (MRI) system. In other embodiments, the data collecting pattern can include a radial pattern. In such embodiments, the k-space data set can include k-space data that was generated by a computed tomography (CT or CATscan) system.

BRIEF DESCRIPTION OF THE DRAWINGS

Features, aspects, and embodiments of the inventions are described in conjunction with the attached drawings, in which.

DETAILED DESCRIPTION

Figure 1:
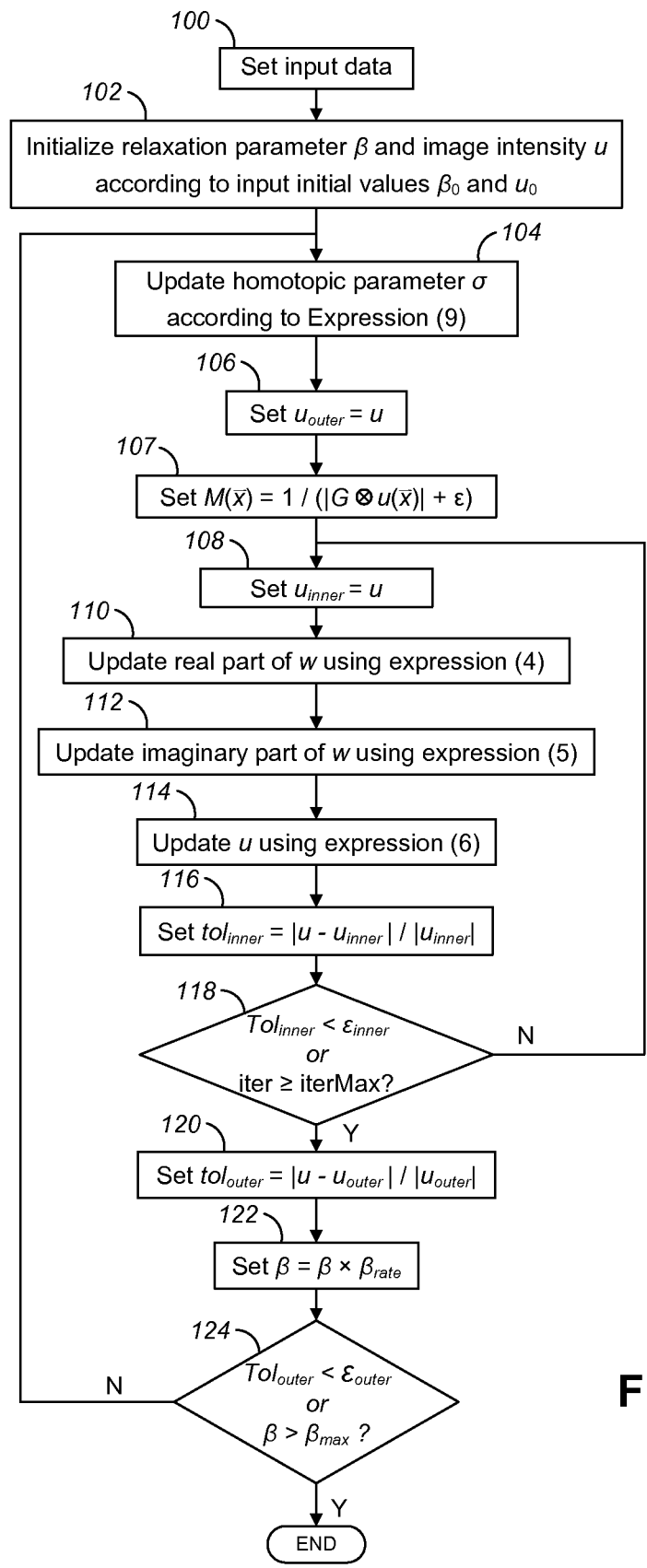
FIG. 1 shows a flowchart of a reconstruction algorithm for the case where l=0 norm.

The present disclosure provides methods for tomographic reconstruction that can be used to produce images using an image processing system, which may include an imaging system and/or means for receiving image data from an imaging system. More specific examples of imaging systems that can incorporate aspects of the present disclosure include systems for Computed tomography (CT or CATscan) using X-Ray or Gamma-Ray tomography, Confocal laser scanning microscopy (LSCM), Cryo-electron tomography (Cryo-ET), Electrical capacitance tomography (ECT), Electrical resistivity tomography (ERT), Electrical impedance tomography (EIT), Functional magnetic resonance imaging (fMRI), Magnetic induction tomography (MIT), Magnetic resonance imaging (MRI) (formerly known as magnetic resonance tomography (MRT) or nuclear magnetic resonance tomography), Neutron tomography, Optical coherence tomography (OCT), Optical projection tomography (OPT), Process tomography (PT), Positron emission tomography (PET), Positron emission tomography-computed tomography (PET-CT), Quantum tomography, Single photon emission computed tomography (SPECT), Seismic tomography, Ultrasound Imaging (US), Ultrasound assisted optical tomography (UAOT), Ultrasound transmission tomography, Photoacoustic tomography (PAT), also known as Optoacoustic Tomography (OAT) or Thermnoaoustic Tomography (TAT), and Zeeman-Doppler imaging, used to reconstruct the magnetic geometry of rotating stars. While this list is extensive, it is not exhaustive, and the present application is applicable to all such similar tomographic reconstruction methods known to those skilled in the art.

The disclosed process involves 1) a model for image reconstruction; 2) an algorithm for rapid numerical solution of the model; and 3) K-space sampling patterns and strategies to improve reconstruction fidelity.

The present application discloses a process for performing tomographic reconstruction of an image of an object from incomplete measured frequency samples of that object where neither the object nor the Fourier transform of the object are sparse, i.e., transform sparsity is not assumed or required, but in fact known not necessarily to strictly hold. The disclosed method includes applying analogous methods of optimization as those used in Compressed Sensing to produce images that optimally exhibit physical attributes known a priori to be exhibited by the objects being imaged, while preferably providing for consistency with the incomplete measured frequency samples. However, prior compressed sensing techniques involve some compressive term in the algorithm. In contrast, the present disclosure presents methods that dispense with the compressive term found in such prior algorithms. Using disclosed methods, the speed of image acquisition can be increased by reducing the amount of frequency sampling required to produce an image. In applications where ionizing radiation or heating of tissue can occur in the imaging of a human subject or delicate object, the absorbed dose or energy can also be reduced, thereby minimizing risk to the object or subject being imaged.

Embodiments of the disclosed process can employ a model that includes applying the a priori knowledge that the signal produced by the underlying object being measured can often be well-approximated by a noiseless piece-wise constant intensity object at some mesoscopic scale in between the pixel/voxel size and the size of the image field of view (FOV). The process can include optimizing these attributes of the corresponding signal intensities while simultaneously attempting to obtain agreement between the Fourier transform of the reconstructed object and the measured Fourier data in a least-squares sense. In this way, the optimization takes the underdetermined problem of reconstructing the object from sparse Fourier data and selects the optimal solution consistent with the measured data in terms of the a priori knowledge of its physical attributes.

The disclosed process is motivated by the observation that in most imaging applications, whether one is imaging a living body or a manufactured object, the underlying object being imaged is well-represented by a noiseless piece-wise constant intensity object. For example, the human body can be seen as a collection of fat or adipose tissue, muscle, bone, soft tissue, brain tissue, lung, and air. These tissues abut each other causing discontinuities in the image, producing contrast used to identify different anatomic or physiological structures.

The present disclosure presents a general model for image reconstruction. The model can have two terms, where the first term is for enforcing the physical a priori attributes of the imaged object, and the second term is for penalizing disagreement of the Fourier transform of the image with the measured Fourier data in a least-squares sense weighted by an importance factor. The first term in the model can be a norm over the variation of the image designed to produce an image that is piece-wise constant, but at the same time does not penalize large discontinuities which are known to exist in the object. The disclosed model for image reconstruction can employ an unconstrained convex-optimization model that maximizes the sparsity of the variation in the image:

$$\min_{\alpha} \alpha \sum_{\bar{x} \in X} M_l(\bar{x}) \|\breve{\nabla} u(\bar{x})\|_l + \frac{1}{2} \sum_{\bar{p} \in K} \eta_{\bar{p}} |\mathfrak{J}_{\bar{p}} u - f_{\bar{p}}|^2, \quad (1)$$

where $l = 0, 1,$ or $2$

In expression (1), $\alpha$ is an importance weighting factor for a priori attributes of the object being imaged, and $u(\bar{x})$ are the image intensities at locations $\bar{x}$. $M_l$ is a norm weighting factor to prevent penalizing large discontinuities, for example, $$M_{1\,or\,2}(\bar{x}) = \frac{1}{|\hat{u}(\bar{x})| + \varepsilon}$$

where $\hat{u}(\bar{x})$ is a smoothed version of $u(\bar{x})$ (this can be achieved in many ways, e.g., with a Gaussian kernel, G, with variance $\sigma_G$) and $\varepsilon$ is a small constant that is included to prevent division by zero when $|\hat{u}(\bar{x})|=0$. $\breve{\nabla}$ is the n-dimensional local finite differences of $u(\bar{x})$ with n-dimensional spatial coordinates $\bar{x}$ in the n-dimensional spatial domain X. Thus, $\|\breve{\nabla}(\bar{x})\|_l$ is the $l_0, l_1,$ or $l_2$ norm of a discretization of the total variation (TV) of the image intensities of the image u. Also, in Expression (1) $\mathfrak{J}_{\bar{p}} = P\mathfrak{J}$, where $\mathfrak{J}$ is the n-dimensional discrete Fourier Transform operator and P is an n-dimensional selection operator corresponding to selected coordinate points $\bar{p}$ in the n-dimensional Fourier domain K. The values $f_{\bar{p}}$ are measured values of the Fourier transform of the image u. The norm weighting factor, $M_l$, plays an important role in reducing the importance of the variation for large image intensities and can be any function that monotonically decreases with $|\hat{u}(\bar{x})|$. Also note that the constraints in the K domain, have been relaxed into a least-squares penalty with a weighting factor, $\eta_{\bar{p}}$, to allow for estimates of the importance of each measured point. This approach allows for providing more importance to measured data that has higher quality or less noise, it can also be used to emphasize the importance of features at different frequencies in the measured data, e.g., the known or expected noise properties as a function of frequency can be incorporated into $\eta_{\bar{p}}$.

Disclosed herein is a very efficient algorithm for solving the model provided in expression (1). The present disclosure includes an embodiment of the algorithm for the case where l=0 norm, and an embodiment of the algorithm for the case where l=1 or 2 norm.

First, the algorithm will be described for embodiments using the l=0 norm. The difficulty with the model explicitly stated in expression (1) when l=0, is that it is numerically inefficient to solve directly because its solution usually requires an intractable combinatorial search. To overcome this issue, an approximation can be used, for example such as the approximation for the $l_0$ norm proposed in Joshua Trzasko & Armando Manduca, *Highly Undersampled Magnetic Resonance Image Reconstruction via Homotopic $l_0$-Minimization*, 28(1) IEEE TRANSACTIONS ON MEDICAL IMAGING, January 2009, at 106-121, which is hereby incorporated by reference, and which is referred to hereinafter as "the Trzasko Article." The Trzasko Article discloses an approximation of the $l_0$ norm by the homotopic minimization of the $l_0$ quasi-norm. Application of such an approximation to the present algorithm leads to a model according to the following expression (2):

$$\min \alpha \sum_{\bar{x} \in X} \log\left(\frac{\|\breve{\nabla} u(\bar{x})\|_{1\,or\,2}}{\sigma} + 1\right) + \frac{1}{2} \sum_{\bar{p} \in K} |\mathfrak{J}_{\bar{p}} u - f_{\bar{p}}|^2 \quad (2)$$

in the limit $\sigma \to 0$

In expression (2), $\sigma$ is a homotopic parameter that is started with $\sigma \gg 0$. Expression (2) is solved for u, decreasing $\sigma$ after each solution until the value of u converges. The approximation can use l=1 or 2 norm to approximate the l=0 solution. Algorithms to solve this model suggested by the Trzasko Article can be inefficient and problematic for applications requiring real-time image reconstruction due to their lesser, though still significant, numerical inefficiency. As measured data typically produces a complex image, we extend the algorithm to deal with both complex frequency data and complex image data as shown below by expression (3):

$$\min_{u,w} \alpha \sum_{\bar{x} \in X} M(\bar{x}) \quad (3)$$

$$\sum_{d} \left\{ \log\left(\frac{\|R(w_d(\bar{x}))\|_{l'}}{\sigma} + 1\right) + \frac{\beta}{2} |R(w_d(\bar{x})) - \breve{\nabla}_d R(u(\bar{x}))|^2 + \right.$$

$$\left. \log\left(\frac{\|I(w_d(\bar{x}))\|_{l'}}{\sigma} + 1\right) + \frac{\beta}{2} |I(w_d(\bar{x})) - \breve{\nabla}_d I(u(\bar{x}))|^2 \right\} +$$

$$\frac{1}{2} \sum_{\bar{p} \in K} \eta_{\bar{p}} |\mathfrak{J}_{\bar{p}} u - f_{\bar{p}}|^2$$

in the limits $\sigma \to 0$ and $\beta \to \infty$

In expression (3), R(.) is the real component operator, I(.) is the imaginary component operator, l' will be 1 or 2 depending on whether the l=1 or 2 norm is used for the approximation, $\breve{\nabla}$ is now defined to be under periodic boundary conditions for u, so that $\breve{\nabla}_d$ are the components of $\breve{\nabla}$ in dimension d and are circulant matrices that can be diagonalized by the discrete Fourier transform $\mathfrak{J}$. A relaxation variable, w, and a quadratic relaxation parameter, $\beta$ have been introduced. In a naive implementation of an algorithm to solve expression (3) directly, one would expect to have at least three loops during implementation: the first loop is on $\sigma \to 0$, and the second loop is on $\beta \to \infty$, and the third loop is for alternating between u and w for given $\sigma$ and $\beta$. However, the present disclosure presents an efficient technique to combine loops on $\sigma$ and $\beta$, while at the same time broadening the usage of the model into a real time imaging application.

To solve u and w according to the presently-disclosed alternative approach, for a given initial u, one can solve w by the shrinkage formulae shown below as expressions (4) and (5):

$$R(w_d(\bar{x})) = \frac{1}{2} \max \quad (4)$$

$$\left\{ \|\breve{\nabla} R(u(\bar{x}))\|_2 - \sigma + \sqrt{\left(\sigma + \|\breve{\nabla} R(u(\bar{x}))\|_2\right)^2 - \frac{4}{\beta}}, 0 \right\} \frac{\breve{\nabla}_d R(u(\bar{x}))}{\|\breve{\nabla} R(u(\bar{x}))\|_2}$$

$$I(w_d(\bar{x})) = \frac{1}{2}\max \left\{ \left\|\check{\nabla} I(u(\bar{x}))\right\|_2 - \sigma + \sqrt{\left(\sigma + \left\|\check{\nabla} I(u(\bar{x}))\right\|_2\right)^2 - \frac{4}{\beta}}, 0 \right\} \frac{\check{\nabla}_d I(u(\bar{x}))}{\left\|\check{\nabla} I(u(\bar{x}))\right\|_2} \quad (5)$$

Then the updated w can be fed, and an updated u can be determined according to expression (6) below:

$$u = \Im^{-1}\left\{ \frac{\alpha\beta\sum_d \Im(\check{\nabla}_d^T)\Im(w_d) + \eta_p P^T f_p}{\alpha\beta\sum_d \Im(\check{\nabla}_d^T)\Im(\check{\nabla}_d) + \eta_p P^T f_p} \right\} \quad (6)$$

In expression (6), $\Im(\check{\nabla}_d^T)$ and $\Im(\check{\nabla}_d)$ are Fourier transforms or kernels of finite difference operators $\check{\nabla}_d^T$ (real) and $\check{\nabla}_d^T$ (complex) respectively.

For each set of given $\sigma$ and $\beta$, expressions (4) and (5) are iterated with (6) until the solutions converge. Then we relax $\sigma$ and $\beta$. In order to make (4) and (5) valid, is desirable to achieve a condition according to the inequality shown below as expression (7):

$$\left(\sigma + \left\|\check{\nabla} u(\bar{x})\right\|_2\right)^2 - \frac{4}{\beta} \geq 0 \quad (7)$$

Since $\|\check{\nabla}\mu(\bar{x})\|_2 \geq 0$, a further relaxation of expression (7), a sufficient condition satisfying (7), can be written as expression (8):

$$\sigma^2 \beta \geq 4 \quad (8)$$

Inequality (8) explicitly provides a guide to simultaneously update $\sigma$ and $\beta$ during the present implementation: start with a very small positive $\beta=1$, then set $\sigma$ according to expression (9):

$$\sigma = \sqrt{\frac{C}{\beta}} \text{ for some } C \geq 4 \quad (9)$$

Thus, a reconstruction algorithm for the case where l=0 norm can proceed according to the flowchart shown in FIG. 1. At block 100, various input data is set. For example, block 100 can include setting values for $\eta_p$, P, $f_p$, $\alpha$, $u_0$, $\beta_0$, $\beta_{max}$, $\beta_{rate}$, $\varepsilon_{inner}$, $\varepsilon_{outer}$, and C.

The weighting factor $\eta_p$ can be a vector of values that are set to control how closely the constructed result will follow the sampled data. Different weights can be assigned for different sampling points along the sampling line or lines in K-space. The weighting factor $\eta_p$, can be set according to known a priori information regarding the noise power spectrum of the sampling device or to weight the importance of different frequencies in the reconstructed image. For example, relatively higher weights, hence importance, can be assigned for sampling points at or near the center of K-space and/or near expected ridges in the K-space, where relatively important frequency data is generally located for some imaging applications such as MRI.

The value P is the representative of the sampling pattern in K-space. The value $f_p$ represents the K-space data sampled along the pattern according to value P. The value $\alpha$ is a scalar that provides a weighting factor for controlling the overall smoothness of the constructed image. Larger values for a tend to lead to smoother images by allow for larger differences between the constructed results and the sampled data. Thus, the value set for $\alpha$ and M{x} can be adjusted to control the smoothness of the image without losing too much of the desired contrast in the image.

The value $u_0$ represents the initial values of the constructed image. Initially, a rough image can be created using the frequency data that is sampled from K-space along the pattern P, for example by applying an inverse Fourier transform to produce image space data from the sampled K-space data. In general, results from any reconstruction technique, such as, for example, backprojection, can be used as the initial image data $u_0$.

The value $\beta_0$ represents an initial weight on the quadratic relaxation, which can begin as a small value, for example less than 1.0. As the algorithm progresses, the quadratic relaxation weight $\beta$ will increase according to a rate $\beta_{rate}$ and will not exceed a maximum $\beta_{max}$. Thus, the value $\beta_{max}$ is the maximum value allowed for quadratic relaxation weight; $\beta_{rate}$ is some value greater than 1 and is the rate at which the quadratic relaxation weight $\beta$ will increase per outer iteration of the present process. The value $\beta_{max}$ can affect maximum processing time (depending on the rate $\beta_{rate}$) and the quality of the final image. The value $\beta_{max}$ can be set large enough to allow for the maximum number of iterations to be in the tens, hundreds, thousands, or larger. So, for example, in some implementations, the value $\beta_{max}$ can be set to $2^{16}$ and the value $\beta_{rate}$ can be set to 2 or 4.

The values $\varepsilon_{inner}$ and $\varepsilon_{outer}$ are tolerance threshold values that are used for inner and outer loop stopping criteria, respectively, as described below. For example, in some implementations, the threshold values $\varepsilon_{inner}$ and $\varepsilon_{outer}$ can be set to a value much smaller than zero, for example 1e-4. Finally, the value C can be set to some value, for example C≥4, so as to maintain a desired relationship between $\sigma$ and $\beta$ according to expression (9).

Next, at block 102, the relaxation parameter â and the image data u are initialized according to initial values for $â_0$ and $u_0$ input at block 100.

A first, outer iterative process begins at block 104, and includes blocks 104-124. This outer iterative process includes a second, inner iterative process that spans blocks 108-118. The outer iterative process includes updating the homotopic parameter $\sigma$ at block 104, setting an outer image data variable $u_{outer}$ equal to the current value of image data u at block 106, and setting a norm weighting factor M at block 107 to prevent the penalization of large discontinuities in the reconstructed image. Additional details regarding the norm weighting factor M are described below in connection with FIG. 2.

Next, some number of iterations of the inner iterative process are performed. The inner iterative process includes setting an inner image data variable u equal to the current value of image data u at block 108. The inner iterative process then includes updating the real part of the relaxation variable w according to expression (4) at block 110, and updating the imaginary part of the relaxation variable w according to expression (5) at block 112. Revised image data is then generated as image data u according to expression (6) at block 114 using the relaxation variable w as revised at blocks 110 and 112.

Next, at block 116, an inner tolerance value $tol_{inner}$ is set according to expression (10):

$$tol_{inner} = \frac{|u - u_{inner}|}{|u_{inner}|} \quad (10)$$

The inner tolerance value $tol_{inner}$ is thus representative of the difference in the image data that was made during the current iteration of the inner iterative process. The inner tolerance value $tol_{inner}$ can then be used to determine whether an additional iteration of the inner iterative process is desirable. Thus, at block 118, a determination is made as to whether another iteration of the inner iterative process should be performed by determining whether the tolerance value $tol_{inner}$ is less than the tolerance threshold value $\varepsilon_{inner}$ that was input at block 100. If not, the process returns to block 108 and the inner iterative process is repeated. Otherwise, the process continues the outer iterative process. Also, at block 118 a counter "iter" can be used to keep track of the number of iterations of the inner iterative process and prevent an infinite loop. If the number of iterations "iter" exceeds a maximum number of iterations "iterMax" then the inner iterative process can be terminated and the process can continue the outer iterative process.

At block 120, an outer tolerance value $tol_{outer}$ is set according to expression (11):

$$tol_{outer} = \frac{|u - u_{outer}|}{|u_{outer}|} \quad (11)$$

The outer tolerance value $tol_{outer}$ is thus representative of the difference in the image data that was made during the current iteration of the outer iterative process, i.e., using the current values of the relaxation and homotopic parameters β and σ for the inner iterative process. The outer tolerance value $tol_{outer}$ can then be used to determine whether an additional iteration of the outer iterative process is desirable.

At block 122, the value of relaxation parameter â is adjusted using the rate set at block 100 as relaxation rate $â_{rate}$ according to $â = â \times â_{rate}$.

A determination is made at block 124 as to whether another iteration of the outer iterative process should be performed by determining whether the outer tolerance value $tol_{outer}$ is less than the outer tolerance threshold value $\varepsilon_{outer}$ that was input at block 100. If not, the process returns to block 104 and the outer iterative process is repeated. Otherwise, the process is completed.

Next, the algorithm will be described for embodiments using the l=1 or 2 norm. For such embodiments, the relaxation of expression (1) is shown below as expression (12):

$$\min_{u,w} \alpha \sum_{\bar{x} \in X} \left\{ R(M(\bar{x})) \| R(w(\bar{x})) \|_l + \frac{\beta}{2} \sum_d \left| R(w_d(\bar{x})) - \widetilde{\nabla}_d R(u(\bar{x})) \right|^2 + I(M(\bar{x})) \| I(w(\bar{x})) \|_l + \frac{\beta}{2} \sum_d \left| I(w_d(\bar{x})) - \widetilde{\nabla}_d I(u(\bar{x})) \right|^2 \right\} + \frac{1}{2} \sum_{p \in K} \eta_p \left| \mathfrak{J}_p u - f_p \right|^2 \quad (12)$$

for $l = 1$ or 2 in the limit $\beta \to \infty$

Then, for a given image u, a shrinkage formula can be used to solve for relaxation variables w according to expressions (13) and (14) for l=1 norm, or according to expressions (15) and (16) for l=2 norm.

$$R(w_d(\bar{x})) = \max\left\{ \left| \widetilde{\nabla}_d R(u(\bar{x})) \right| - \frac{R(M(\bar{x}))}{\beta}, 0 \right\} \quad (13)$$

$$\text{sign}\left( \widetilde{\nabla}_d R(u(\bar{x})) \right)$$

$$I(w_d(\bar{x})) = \max\left\{ \left| \widetilde{\nabla}_d I(u(\bar{x})) \right| - \frac{I(M(\bar{x}))}{\beta}, 0 \right\} \quad (14)$$

$$\text{sign}\left( \widetilde{\nabla}_d I(u(\bar{x})) \right)$$

$$R(w_d(\bar{x})) = \max\left\{ \left\| \widetilde{\nabla} R(u(\bar{x})) \right\|_2 - \frac{R(M(\bar{x}))}{\beta}, 0 \right\} \cdot \frac{\widetilde{\nabla}_d R(u(\bar{x}))}{\left\| \widetilde{\nabla} R(u(\bar{x})) \right\|_2} \quad (15)$$

$$I(w_d(\bar{x})) = \max\left\{ \left\| \widetilde{\nabla} I(u(\bar{x})) \right\|_2 - \frac{I(M(\bar{x}))}{\beta}, 0 \right\} \cdot \frac{\widetilde{\nabla}_d I(u(\bar{x}))}{\left\| \widetilde{\nabla} I(u(\bar{x})) \right\|_2} \quad (16)$$

Under cyclic boundary conditions, we have for both cases l=1 or 2 the resulting expression (17):

$$u = \mathfrak{J}^{-1} \left\{ \frac{\alpha \beta \sum_d \mathfrak{J}\left(\widetilde{\nabla}_d^T\right) \mathfrak{J}(w_d) + \eta_p P^T f_p}{\alpha \beta \sum_d \mathfrak{J}\left(\widetilde{\nabla}_d^T\right) \mathfrak{J}\left(\widetilde{\nabla}_d\right) + \eta_p P^T P} \right\} \quad (17)$$

Figure 2:
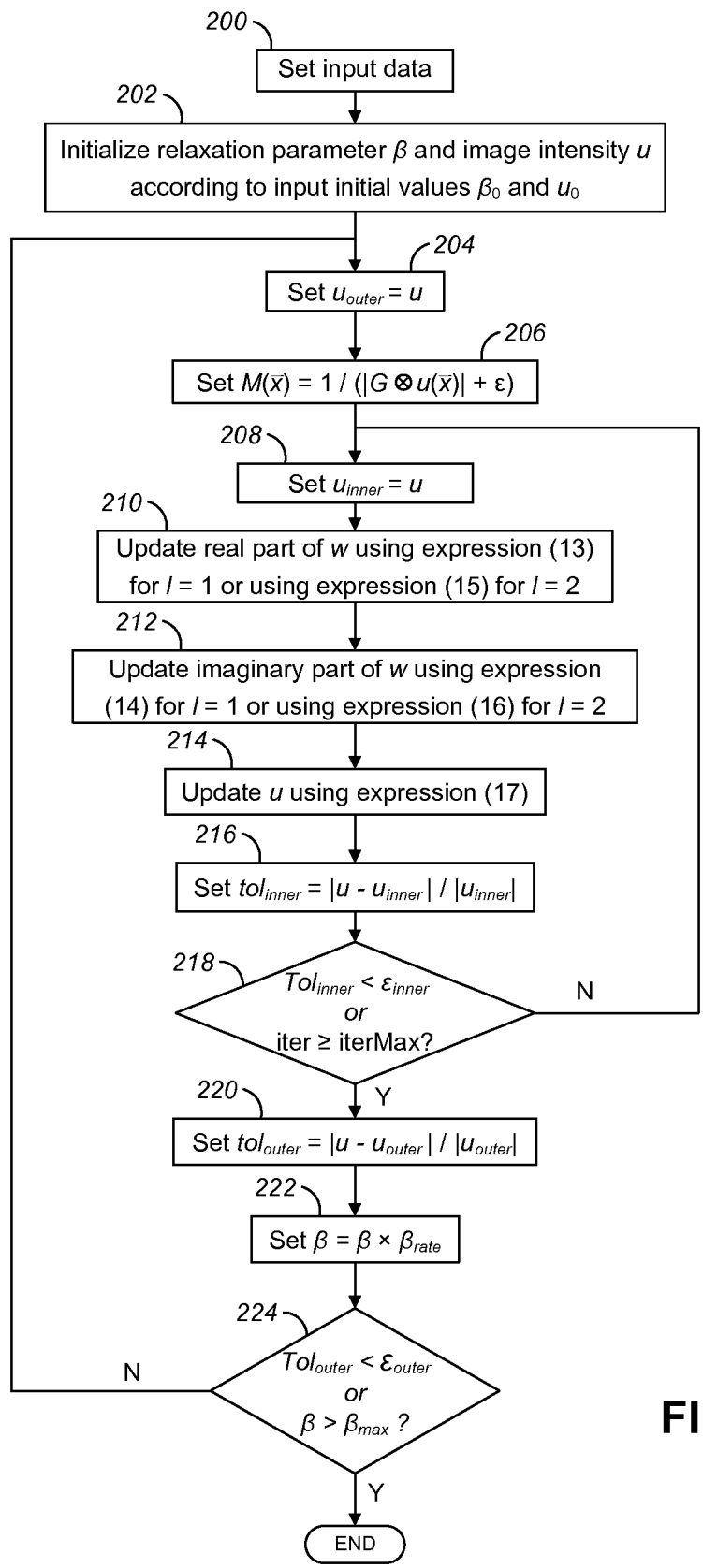
FIG. 2 shows a flowchart of a reconstruction algorithm for the case where l=1 or 2 norm.

Thus, a reconstruction algorithm for the case where l=1 or 2 norm can proceed according to the flowchart shown in FIG. 2. At block 200, various input data is set. For example, block 200 can include setting values for $\eta_p$, $\sigma_G$, P, $f_p$, α, $u_0$, $β_0$, $β_{max}$, $β_{rate}$, ε, $\varepsilon_{inner}$, and $\varepsilon_{outer}$.

The weighting factor $\eta_p$ can be a vector of values that are set to control how closely the constructed result will follow the sampled data. Different weights can be assigned for different sampling points along the sampling line or lines in K-space. The weighting factor $\eta_p$ can be set according to a priori information regarding the noise power spectrum of the sampling device or to weight the importance of different frequencies in the reconstructed image. For example, relatively higher weights, hence importance, can be assigned for sampling points at or near the center of K-space and/or near expected ridges in the K-space, where relatively important frequency data is generally located for some imaging applications such as MRI.

The value $\sigma_G$ is the standard deviation for the Gaussian kernel G (e.g., expressions (18), (18")). The value P is the sampling pattern in K-space. The value $f_p$ represents the K-space data sampled along the pattern according to value P. The value α is a scalar that provides a weighting factor for controlling the overall smoothness of the constructed image. Larger values for α tend to lead to smoother images by allow for larger differences between the constructed results and the sampled data. Thus, the value set for α can be adjusted to control the smoothness of the image without losing too much of the desired contrast in the image.

The value $u_0$ represents the initial values of the constructed image. Initially, a rough image can be created using the frequency data that is sampled from K-space along the pattern P, for example by applying an inverse Fourier transform to produce image space data from the sampled K-space data. In general, results from any reconstruction technique, such as, for example, backprojection, can be used as the initial image data $u_0$.

The value $\beta_0$ represents an initial weight on the quadratic relaxation, which can begin as a small value, for example less than 1.0. As the algorithm progresses, the quadratic relaxation weight $\beta$ will increase according to a rate $\beta_{rate}$ and will not exceed a maximum $\beta_{max}$. Thus, the value $\beta_{max}$ is the maximum value allowed for quadratic relaxation weight; $\beta_{rate}$ is some value greater than 1 and is the rate at which the quadratic relaxation weight $\beta$ will increase per iteration of the present process. The value $\beta_{max}$ can affect maximum processing time (depending on the rate $\beta_{rate}$) and the quality of the final image. The value $\beta_{max}$ can be set large enough to allow for the maximum number of iterations to be in the tens, hundreds, thousands, or larger. So, for example, in some implementations, the value $\beta_{max}$ can be set to $2^{16}$ and the value $\beta_{rate}$ can be set to 2 or 4.

The values $\varepsilon_{inner}$ and $\varepsilon_{outer}$ are tolerance threshold values that are used for inner and outer loop stopping criteria, respectively, as described below. For example, in some implementations, the values $\varepsilon_{inner}$ and $\varepsilon_{outer}$ can be set to a value much smaller than zero, for example 1e-4.

The value s is the small constant that is included to prevent division by zero when $|\bar{u}(\bar{x})|=0$.

Next, at block 202, the relaxation parameter â and the image data u are initialized according to initial values for $â_0$ and $u_0$ input at block 200.

A first, outer iterative process begins at block 204, and includes blocks 204-224. This outer iterative process includes a second, inner iterative process that spans blocks 208-218. The outer iterative process includes setting an outer image data variable $u_{outer}$ equal to the current value of image data u at block 204, and setting a norm weighting factor M at block 206 to prevent the penalization of large discontinuities in the reconstructed image. In this embodiment, the norm weighting factor M is set using a Gaussian kernel G according to expression (18) below.

$$M(\bar{x}) = \frac{1}{|G \otimes u(\bar{x})| + \varepsilon} \quad (18)$$

However, other methods can be used, for example as shown below in expressions (18') and (18").

$$M(\bar{x}) = e^{-|u(\bar{x})|} \quad (18')$$

$$M(\bar{x}) = \log\left(\frac{1}{|G \otimes u(\bar{x})| + \varepsilon} + 1\right) \quad (18'')$$

Generally speaking, any function that is positive and decreasing on [0, +inf) can potentially be used.

Next, some number of iterations of the second process are performed. The second iterative process includes setting an outer image data variable $u_{outer}$ equal to the current value of image data u at block 208. At block 210, the real part of w is updated according to expression (13) for l=1 norm or according to expression (15) for l=2 norm. At block 212, the imaginary part of w is updated according to expression (14) for l=1 norm or according to expression (16) for l=2 norm. Revised image data is then generated as image data u according to expression (17) at block 214 using the relaxation variable w as revised at blocks 210 and 212.

Next, at block 216, an inner tolerance value $tol_{inner}$ is set according to expression (10). The inner tolerance value $tol_{inner}$ is representative of the difference in the image data that was made during the current iteration of the inner iterative process. The inner tolerance value $tol_{inner}$ can then be used to determine whether an additional iteration of the inner iterative process is desirable. Thus, at block 218, a determination is made as to whether another iteration of the inner iterative process should be performed by determining whether the tolerance value $tol_{inner}$ is less than the tolerance threshold value $\varepsilon_{inner}$ that was input at block 200. If not, the process returns to block 208 and the inner iterative process is repeated. Otherwise, the process continues the outer iterative process. Also, at block 218 a counter "iter" can be used to keep track of the number of iterations of the inner iterative process and prevent an infinite loop. If the number of iterations "iter" exceeds a maximum number of iterations "iterMax" then the inner iterative process can be terminated and the process can continue the outer iterative process.

At block 220, an outer tolerance value $tol_{outer}$ is determined according to expression (11). The outer tolerance value $tol_{outer}$ is representative of the difference in the image data that was made during the current iteration of the outer iterative process, i.e., using the current values of the norm weighting factor M and relaxation parameter $\beta$. The outer tolerance value $tol_{outer}$ can then be used to determine whether an additional iteration of the outer iterative process is desirable.

At block 222, the value of relaxation parameter â is adjusted using the rate set at block 200 as relaxation rate $â_{rate}$ according to $â=â \times â_{rate}$.

A determination is made at block 224 as to whether another iteration of the outer iterative process should be performed by determining whether the outer tolerance value $tol_{outer}$ is less than the outer tolerance threshold value $\varepsilon_{outer}$ that was input at block 200. If not, the process returns to block 204 and the outer iterative process is repeated. Otherwise, the process is completed.

In some embodiments of the processes shown in FIGS. 1 and 2 and described above, the denominators in expressions (6) and (17) can be pre-computed for efficiency and that the numerators of these expressions can be evaluated either by interpolation of the dense K-Space produced by u or by gridding of the sparse K-Space samples onto a Cartesion grid via Sinc interpolation.

Another important aspect of image reconstruction involves the sampling pattern P that is used for sampling the K-space or K domain version of the image data. The sampling of the K-space or K domain has an important impact on the quality of the reconstructed image. In many imaging techniques (e.g. computed tomography), projections of a signal through an object are measured, and their Fourier transform produces radial central-slice theorem profiles in K-space. In imaging techniques analogous to magnetic resonance (MR) imaging, for example, K-space trajoctories are measured along continuous paths that are manipulated by the gradient system and encoding axis.

The patterns of real imaged objects in K-space tend to be peaked at the origin and have ridges of intensity that project out radially from the center. In general, for the best reconstruction, it is desirable to sample the projecting ridges several times with a single continuous sampling path. Spiral trajectories were originally developed in order to cover as much K-space as possible with a single excitation in as short as possible time. Because the spiral trajectory orbits the center of K-space multiple times, it can provide an excellent sparse sampling pattern for the reconstruction technique described herein. It is also known in the art, that better knowledge of the center of K-space leads to better image reconstruction. Using spiral trajectories to cover a 2D or 3D K-space leads to denser or repeated sampling information at the center of K-space, improving image reconstruction. Repeated sampling improves our a priori knowledge of the measured K-space data and this is accommodated in our model via $\eta_p$.

While various sampling patterns, including non-spiral sampling patterns, can be employed with aspects of the present disclosure, the following description provides an explanation of some preferred embodiments of spiral K-space sampling. For one 2D spiral with center (Cx,Cz), given a as a positive constant and $\xi$ as a constant shifting parameter for determining which leaf the trajectory will pass, an Archimedean spiral can be fabricated from the origin according to the system shown generally below as expression (19):

$$\begin{cases} r = a\theta & \text{(polar coordinates)} \\ x = r\cos(\theta + \xi) + Cx & \text{(Cartesian } x\text{)} \\ z = r\sin(\theta + \xi) + Cz & \text{(Cartesian } z\text{)} \end{cases} \quad (19)$$

The sampling along this trajectory can be varied. A denser sampling near the center of K-space can be acquired with a spiral trajectory, and this improves the quality of the overall reconstruction. Spiral patterns can be created to fill or tile K-space by rotating them by $\xi$, where the angles can be uniformly or stochastically distributed. If ciné imaging is being performed, the acquisition of repeated images can cycle through these different patterns. Additionally, the K-space data can be included from the previous or subsequent scans with weighting factors, $\eta_p$, set to temporally weight the importance of the reconstruction data.

These 2D spiral patterns can be acquired in 3D along the read axis, which provides for a very fast acquisition technique in 3D. They can also be combined with uniformly or stochastically distributed Cartesian or radial trajectories. 2D patterns can also be used to sample a 3D K-space by rotating a planar spiral trajectory around an axis in the plane. To put this mathematically, for a rotation around Z-axis with angle $\varphi_i$, we can have the following expression (20) for one 3D spiral.

$$\begin{cases} r = a\theta & \text{(polar coordinates)} \\ x = r\cos(\theta + \xi) + \cos(\varphi_i) + C_x & \text{(Cartesian } x\text{)} \\ y = r\cos(\theta + \xi) + \cos(\varphi_i) + C_y & \text{(Cartesian } y\text{)} \\ x = r\sin(\theta + \xi) & \text{(Cartesian } z\text{)} \end{cases} \quad (20)$$

Varying the rotation $\varphi_i$ can generate different planar spirals that cover the 3D K-space. For instance, using ten evenly distributed rotation angles according to expression (21) with $\alpha=4/\pi$ and $\xi=0$, the spiral trajectories shown in FIG. 3 can be achieved.

$$\varphi_i = \frac{2\pi i}{10}, i = 0, 1, 2, \ldots, 9 \quad (21)$$

Figure 4:
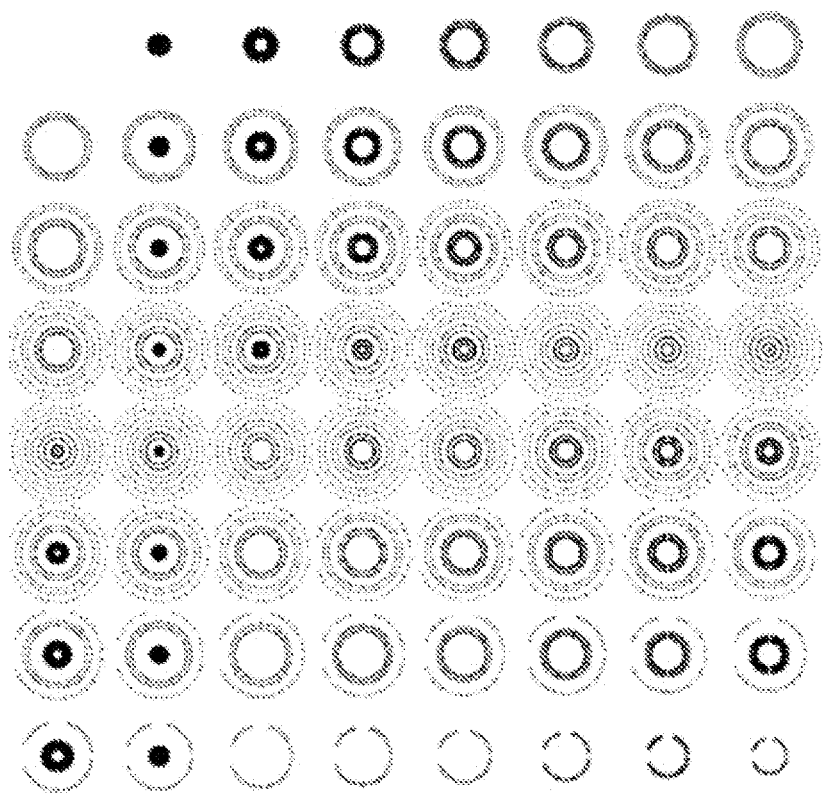
FIG. 4 shows a series of sampling mask patterns that can be achieved by slicing the spiral trajectories shown in FIG. 3.

FIG. 4 a discrete 3D sampling mask, which includes a set of patterns that can be achieved by increasing the number of evenly distributed rotation angles to, e.g., 50, and slicing the trajectory masks by different z values. The mask shown in FIG. 4 allows for a 9.13% K-space sampling ratio.

Figure 3:
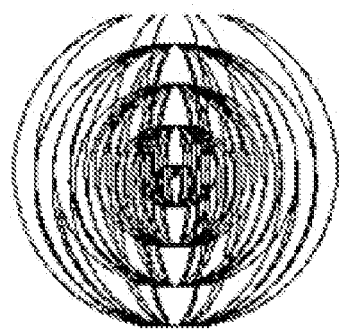
FIG. 3 shows spiral trajectories that can be used for 3D K-space sampling.

The spiral pattern shown in FIGS. 3 and 4 is very sparse, yet samples across the projecting features in K-space. At the same time, it provides repeated samplings of the center of K-space and a dense pattern near the origin. The disclosed image reconstruction sensing techniques favor sampling with a high degree of incoherence to cover the projecting features in K-space. While this high degree incoherence can be achieved by random sampling or Poisson sampling, this requires many trajectories to produce even a sparse sampling of 2D or 3D K-space. In order to incorporate some incoherence into the disclosed 3D Spiral sampling pattern, in some embodiments pseudo-random shifts can be introduces into the trajectory planes of the rotated 2D spiral patterns described above. Such pseudo-random shifting provides for improved coverage of the 3D K-space with fewer gaps in the sampling.

In this new approach, the spiral planes will still be rotated by pseudo-random amounts to cover the 3D K-space. In the most general case, the orientation of the normal vectors to the sampling plane can be randomly generated, and a random phase shift to spiral can be included. The plane origins can also be shifted, but large shifts are not preferred as repeated and dense sampling of the origin of K-Space is desired. One can also perturb the spiral trajectories to deviate by small amounts in and out of the sampling planes.

For example, in some embodiments, an initial spiral plane is rotated along an axis containing the plane, with different rotation angle $\varphi_i$, i=0, 1, . . . , N−1. The shifting angle in each rotated plane may involve different values $\xi_i$, i=0, . . . , N−1. Thus, the new trajectories have a more flexible formulation as shown below as expression (22).

$$\begin{cases} r = a\theta & \text{(polar coordinates)} \\ x = r\cos(\theta + \xi_i) + \cos(\varphi_i) + C_x & \text{(Cartesian } x\text{)} \\ y = r\cos(\theta + \xi_i) + \sin(\varphi_i) + C_y & \text{(Cartesian } y\text{)} \\ x = r\sin(\theta + \xi_i) + C_z & \text{(Cartesian } z\text{)} \end{cases} \quad (22)$$

The values of $\xi_i$ and $\varphi_i$ can vary freely to produce different patterns. Although the sampling patterns are pseudo-random in nature, one can use a fixed pattern for image acquisition or employ an acquisition scheme that implements the pseudo-random shifting at the time of measurement.

Figure 5:
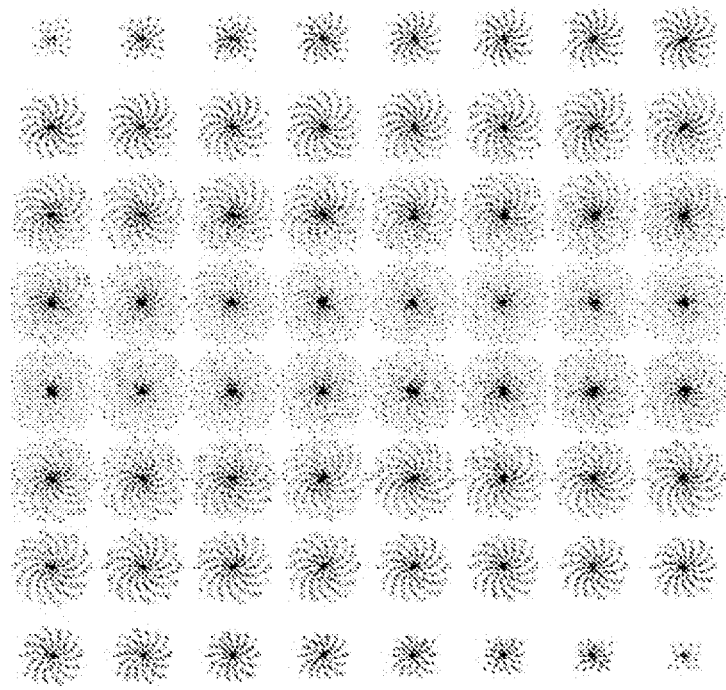
FIG. 5 shows a set of spiral patterns for K-space sampling that are generated with fixed shifting angles.
Figure 6:
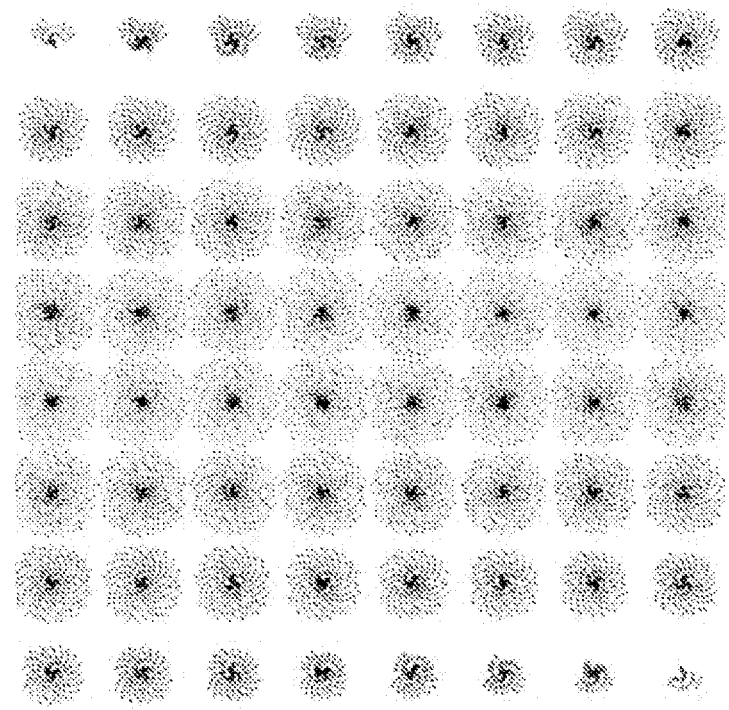
FIG. 6 shows a set of spiral patterns for K-space sampling that are generated with varied shifting angles.

The disclosed combined process of image acquisition and reconstruction is referred to herein as the shifted hybrid Archimedean random pattern spiral or SHARPS technique. In the images shown in FIGS. 5 and 6, one set of spiral patterns was generated with fixed shifting angles, and the other set was generated by varying the shifting angle $\xi_i$. Image reconstruction parameter settings for reconstruction were the same for all experiments.

For example, a symmetric rotation scheme can be chosen according to expression (23):

$$\begin{cases} \varphi_i = \frac{2\pi i}{N}, & i = 0, \ldots, N-1 \\ \xi_i = i\Phi, & i = 0, \ldots, N-1 \end{cases} \quad (23)$$

or a non-symmetric rotation scheme can be chosen according to expression (24):

$$\begin{cases} \varphi_i = \frac{\pi i}{N}, & i = 0, \ldots, N-1 \\ \xi_i = i\Phi, & i = 0, \ldots, N-1 \end{cases} \quad (24)$$

By choosing appropriate N and Φ, the mask corresponding to the trajectories of expression (22) can be made more suitable for the present image reconstruction process. For example, the mask shown in FIG. 5 can be achieved using the symmetric rotation scheme according to expression (23) by setting α=4/π, N=50, and Φ=(9/16) π. The mask shown in FIG. 5 allows for a 9.86% K-space sampling ratio. The mask shown in FIG. 6 can be achieved using the non-symmetric rotation scheme according to expression (24) by setting α=4/π, N=50, and Φ=(9/16) π. The mask shown in FIG. 6 allows for 10.37% K-space sampling ratio.

Figure 7:
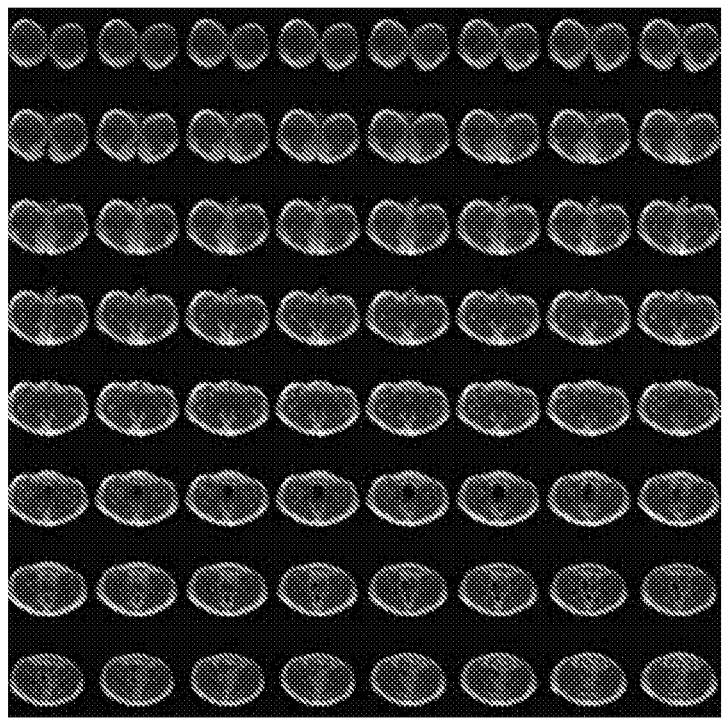
FIGS. 7-11 show sets of images for comparing the results of different reconstruction techniques.
Figure 8:
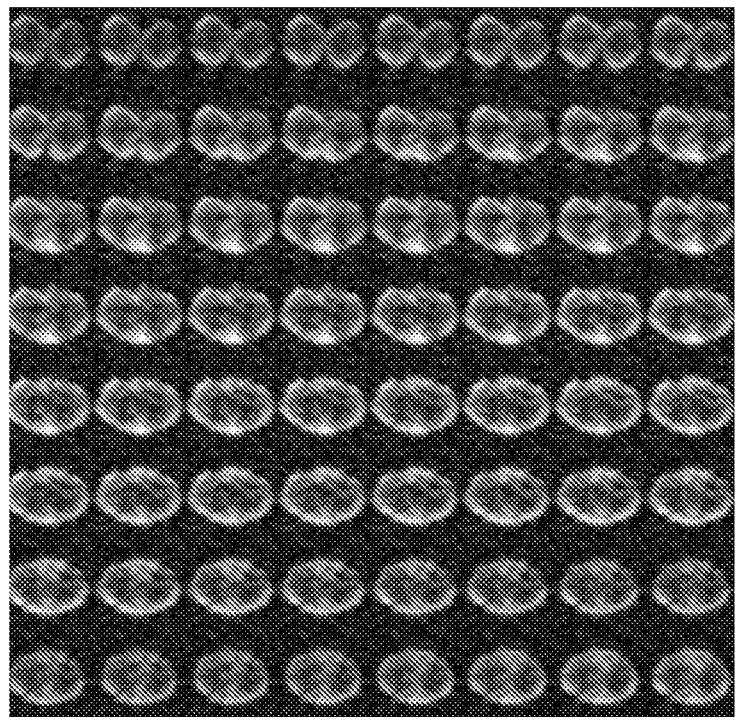
Figure 9:
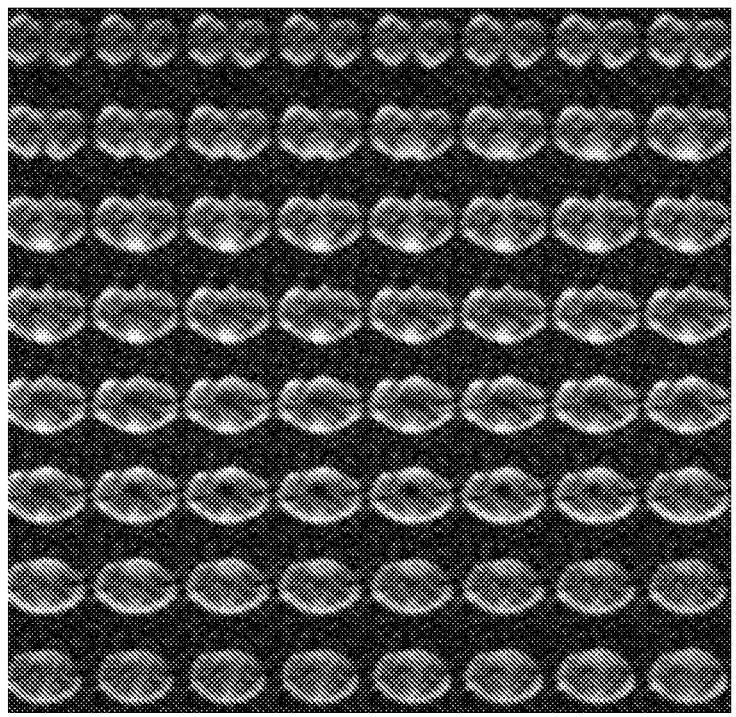
Figure 10:
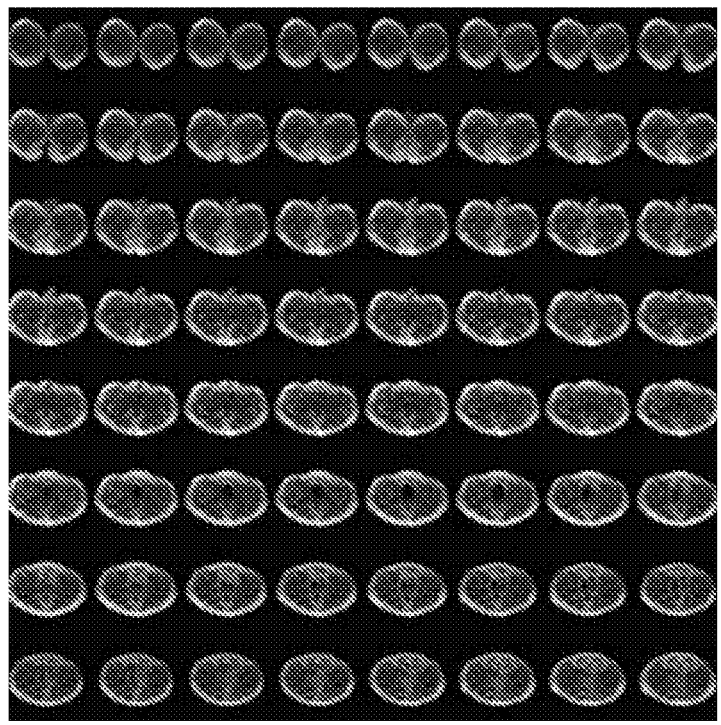
Figure 11:
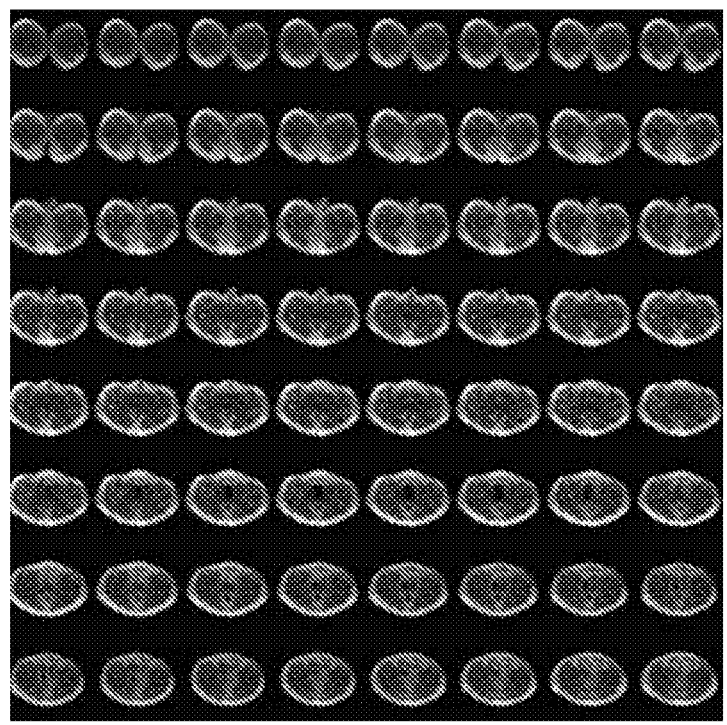

FIGS. 7-11 show images illustrating the difference between original images (FIG. 7), images produced using backprojection reconstruction (FIGS. 8 and 9), and images produced using the presently disclosed reconstruction processes (FIGS. 10 and 11). More specifically, the series of images shown in FIG. 7 are original images used as a baseline for comparison of different reconstruction techniques. The image data for the images shown in FIG. 7 was transformed into K-space via Fourier transform, and then reconstructed using backprojection (FIGS. 8 and 9) and also reconstructed using the presently disclosed reconstruction technique (FIGS. 10 and 11).

The images shown in FIGS. 8 and 9 were produced using the backprojection reconstruction algorithm. More specifically, the images shown in FIG. 8 were obtained using the symmetric mask shown in FIG. 5, and the images shown in FIG. 9 were obtained using the non-symmetric mask shown in FIG. 6.

In contrast, the images shown in FIGS. 10 and 11 were produced using algorithms disclosed herein. More specifically, the images shown in FIG. 10 were obtained using the symmetric mask shown in FIG. 5, and the images shown in FIG. 11 were obtained using the non-symmetric mask shown in FIG. 6. Compared to the images produced using the prior backprojection reconstruction process, the images produced using the present process showed significant improvement. The images shown in FIGS. 8 and 9 that were produced using the backprojection reconstruction process included relative errors of 42.16% and 40.36%, respectively. In contrast, the images shown in FIGS. 10 and 11 that were produced using the present reconstruction process included relative errors of only 15.81% and 15.00%, respectively.

Similarly, the process can also be performed using 3D spirals using rotation only, without shifting, i.e., by setting Φ=0, in expressions (23) and (24). Table 1 below shows a comparison of sampling patterns with shifting (Φ≠0) and without shifting (Φ=0), using symmetric rotation (expression 23) and non-symmetric rotation (expression 24) based on a 64×64×64 cubic volume.

TABLE 1

| Mask Generation | | Parameters (α, N, Φ) | Sampling ratio in K-space | Relative error after back-projection | Relative error after present algorithm |
|---|---|---|---|---|---|
| No shift | Symmetric | (4/π, 50, 0) | 9.13% | 54.84% | 19.29% |
| | Non-Sym | (4/π, 50, 0) | 7.68% | 66.43% | 37.86% |
| With shift | Symmetric | (4/π, 50, 9π/16) | 9.86% | 42.16% | 15.81% |
| | Non-Sym | (4/π, 50, 9π/16) | 10.37% | 40.36% | 15.00% |

From Table 1, it can be observed that using 3D spiral with interleaf shifting provides better results than those without shifting, in all aspects. Between two masks using shifting, the results using non-symmetric rotation are slightly better than those using symmetric rotation, in all aspects.

The presently disclosed approach to generating a K-space sampling pattern for the present image acquisition and reconstruction process has thus been demonstrated. The new approach makes the shifting angle change during rotation of spiral planes, and improves K-space sampling ratio to a higher level, even when using the same numbers of spirals.

Further 2D results using the model and algorithms disclosed herein are described below. The associated illustrated reconstructions are for 128×128 pixel images, and the computational times require less than 2 seconds for an implementation in Matlab.

FIGS. 12A-15D provide examples of image reconstruction with spiral sampling of K-Space. In the examples shown in FIGS. 12A-14D, the K-space sampling covers 13% of the K domain, which can be acquired on a clinical scanner in approximately 11 ms. In the examples shown in FIGS. 15A-15D, the K-space sampling covers 54.29% of the K domain.

Figure 12A:
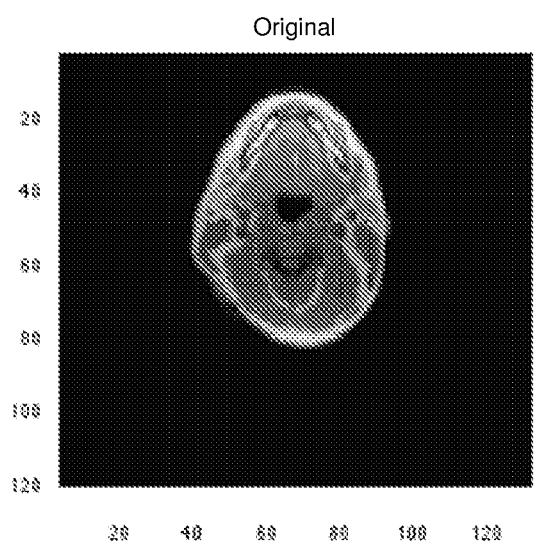
FIGS. 12A-15D show sets of images for comparison of an original image to images reconstructed using different reconstruction techniques and an illustrated k-space sparse spiral sampling.
Figure 12B:
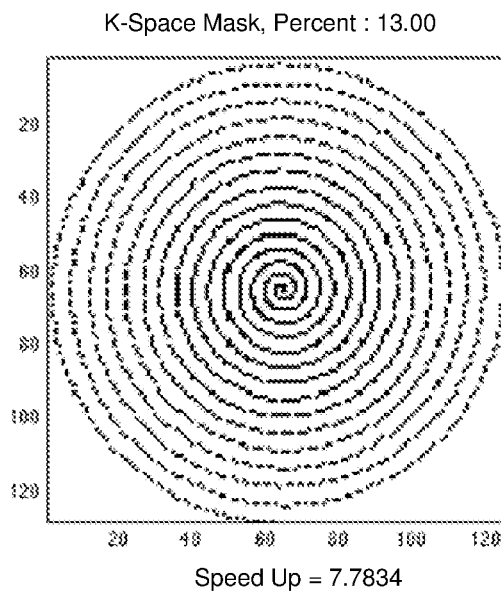
Figure 12C:
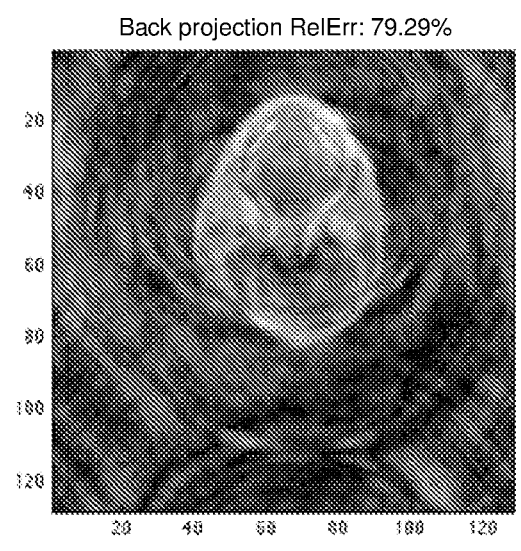
Figure 12D:
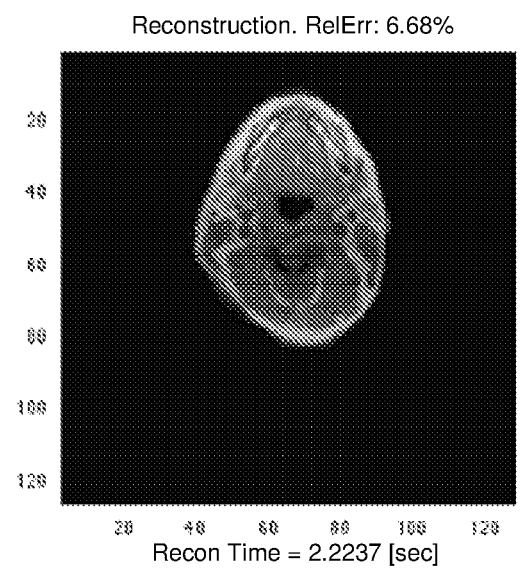

More specifically, FIGS. 12A-12D show examples of images associated with an image reconstruction process for an axial 0.35 Tesla (T) MR image of the head and neck. FIG. 12A shows the original baseline image. FIG. 12B shows the sparse spiral used for sampling of the K-space of the image shown in FIG. 12A to produce the image shown in FIG. 12D. FIG. 12C shows the resulting image when produced using the backprojection technique, which has a relative error of 79.29%. FIG. 12D shows the resulting image using the disclosed algorithm with the l=2 norm, which has a much lower relative error of 6.68%.

Figure 13A:
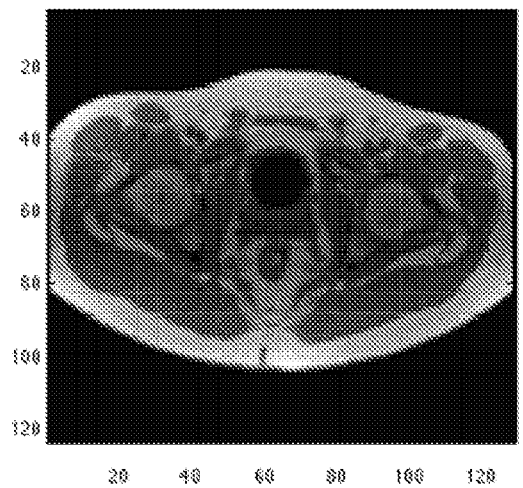
Figure 13B:
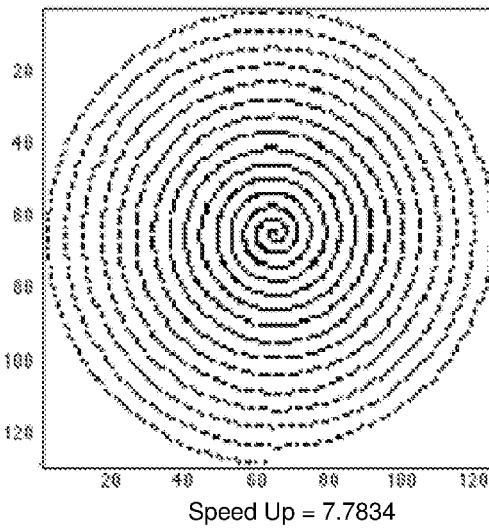
Figure 13C:
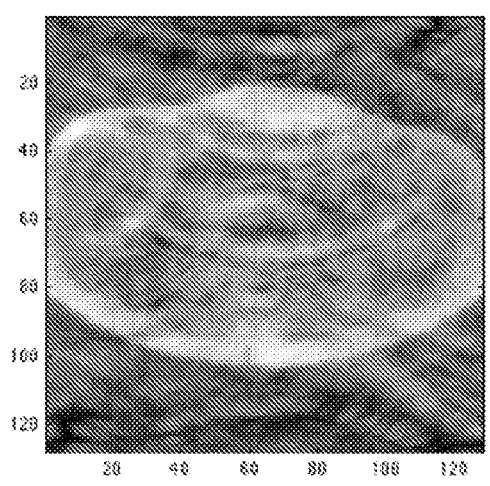
Figure 13D:
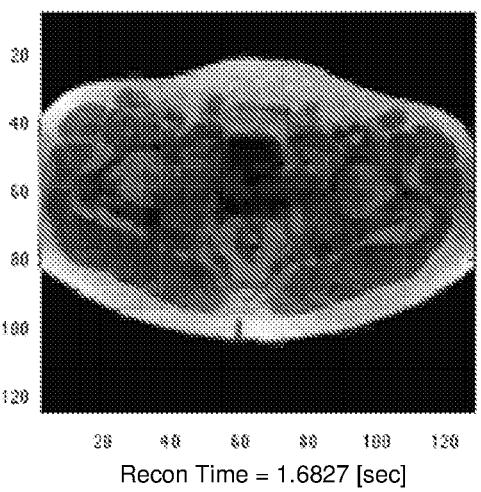

FIGS. 13A-13D show examples of images associated with an image reconstruction process for an axial 0.35 T MR image of the prostate. FIG. 13A shows the original baseline image. FIG. 13B shows the sparse spiral used for sampling of the K-space of the image shown in FIG. 13A to produce the image shown in FIG. 13D. FIG. 13C shows the resulting image when produced using the backprojection technique, which has a relative error of 62.93%. FIG. 13D shows the resulting image using the disclosed algorithm with the l=2 norm, which has a much lower relative error of 7.40%.

Figure 14A:
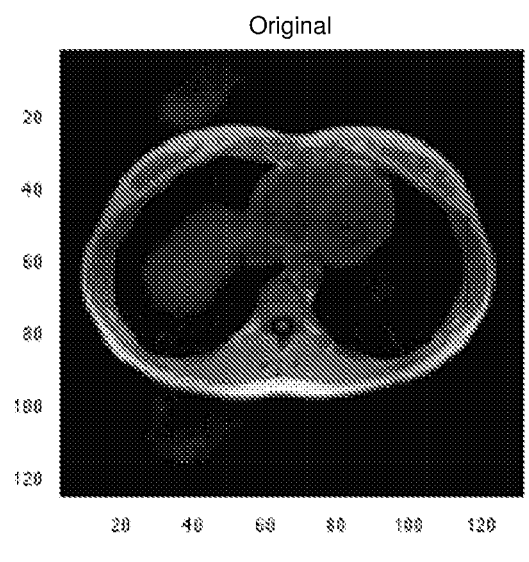
Figure 14B:
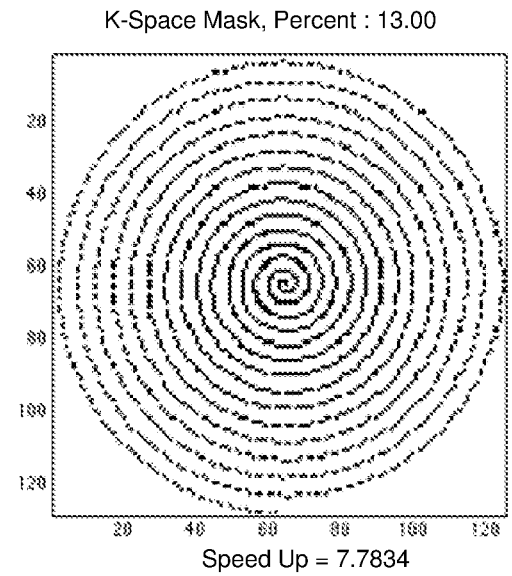
Figure 14C:
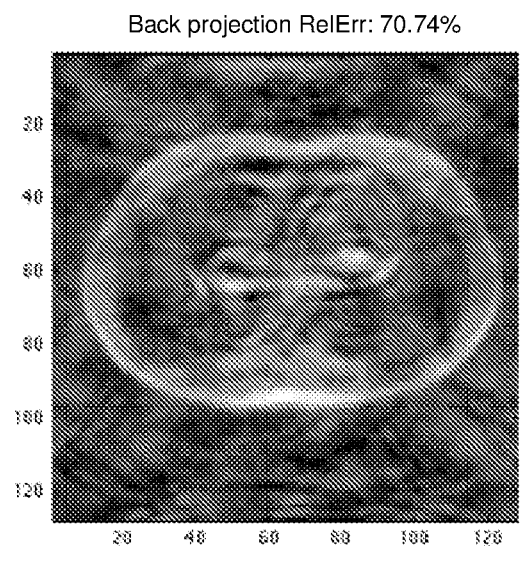
Figure 14D:
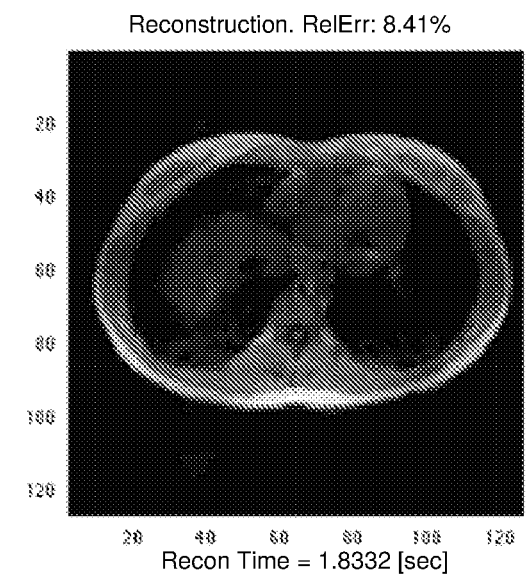

FIGS. 14A-14D show examples of images associated with an image reconstruction process for an axial 0.35 T MR image of the thorax. FIG. 14A shows the original baseline image. FIG. 14B shows the sparse spiral used for sampling of the K-space of the image shown in FIG. 14A to produce the image shown in FIG. 14D. FIG. 14C shows the resulting image when produced using the backprojection technique, which has a relative error of 70.74%. FIG. 14D shows the resulting image using the disclosed algorithm with the l=2 norm, which has a much lower relative error of 8.41%.

Figure 15A:
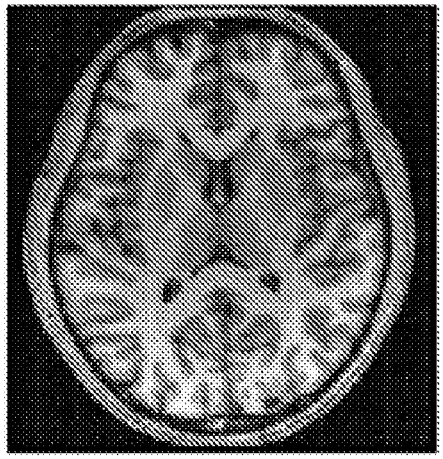
Figure 15B:
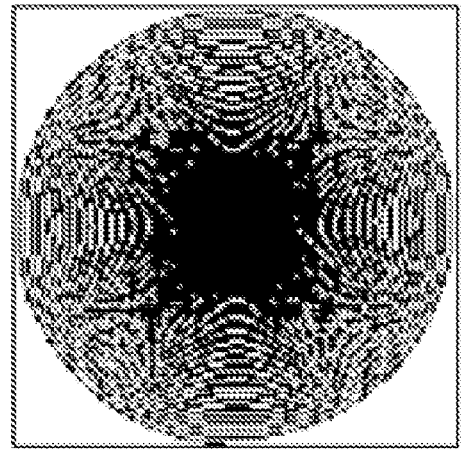
Figure 15C:
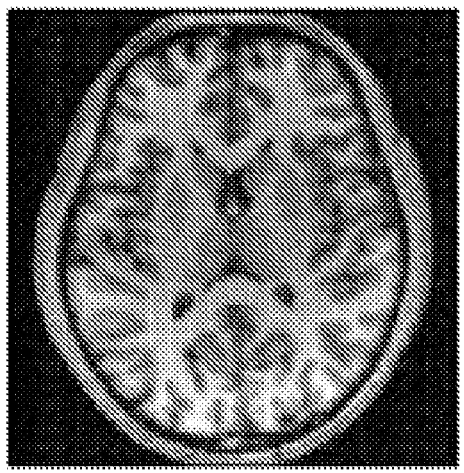
Figure 15D:
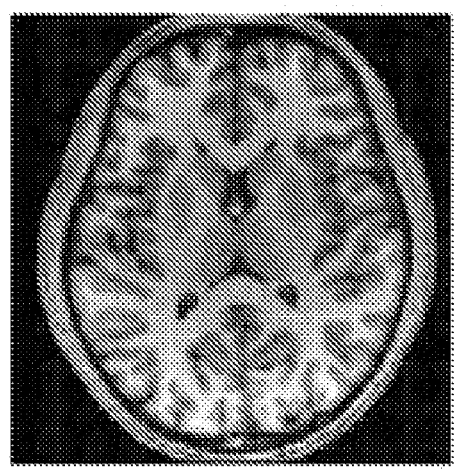

FIGS. 15A-15D show examples of images associated with an image reconstruction process for an axial 0.35 T MR image of the brain using complex image data and two equally-spaced spirals. FIG. 15A shows the original baseline image. FIG. 15B shows the two sparse spirals used for sampling the K-space of the image shown in FIG. 15A to produce the image shown in FIG. 15D. FIG. 15C shows the resulting image when produced using the backprojection technique, which has a relative error of 7.74%. FIG. 15D shows the resulting image using the disclosed algorithm with the l=2 norm, which has a lower relative error of 5.93%.

FIGS. 16A-19D provides examples of image reconstruction with sparse radial sampling of K-Space covering just less than 25% of the K domain. In addition to improved relative error, the use of the presently disclosed algorithms in generating the images in FIGS. 16C, 16D, 17C, 17D, 18C, 18D, 19C, and 19D demonstrated an increase in image acquisition speed of just greater than a factor of four.

Figure 16A:
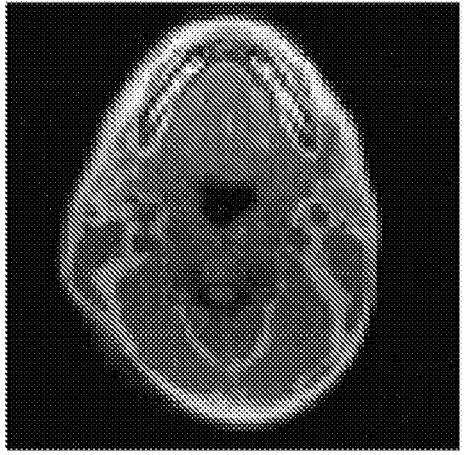
FIGS. 16A-19D show sets of images for comparison of an original image to images reconstructed using different reconstruction techniques and an illustrated k-space sparse radial sampling pattern.
Figure 16B:
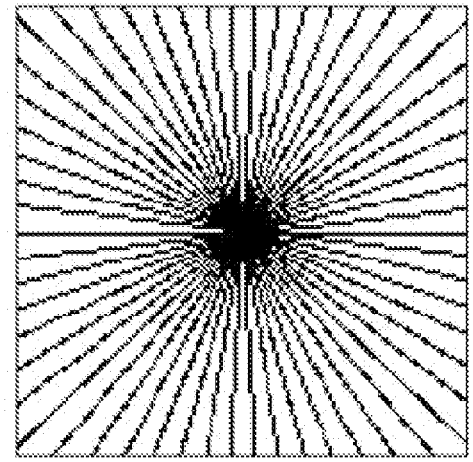
Figure 16C:
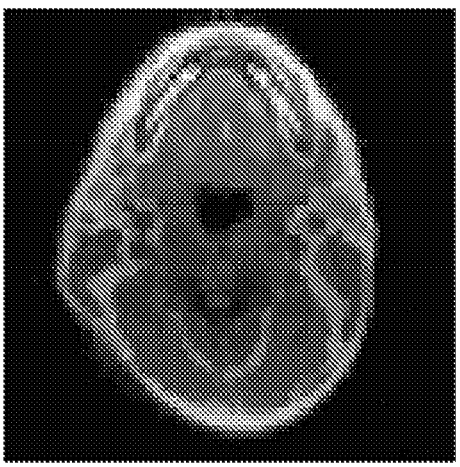
Figure 16D:
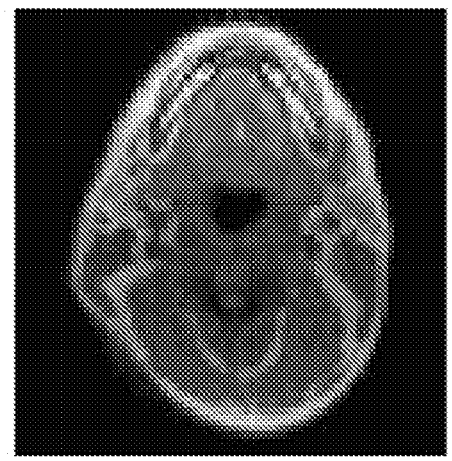

FIGS. 16A-16D show examples of images associated with an image reconstruction process for an axial 0.35 T MR image of the head and neck. FIG. 16A shows the original baseline image. FIG. 16B shows the sparse radial pattern used for sampling of the K-space of the image shown in FIG. 16A using 29 trajectories to produce the images shown in FIGS. 16C and 16D. FIG. 16C shows the resulting image using the disclosed algorithm with the l=0 norm, and FIG. 16D shows the resulting image using the disclosed algorithm with the l=2 norm. The images in FIGS. 16C and 16D have relative errors of 8.47% and 6.78%, respectively.

Figure 17A:
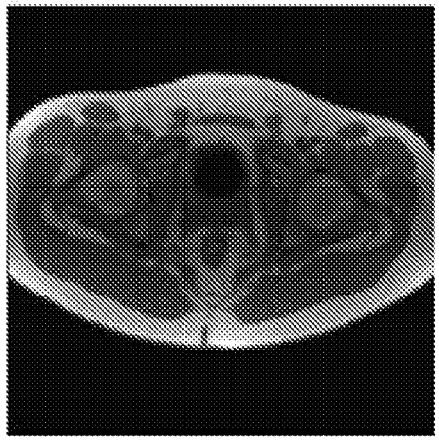
Figure 17B:
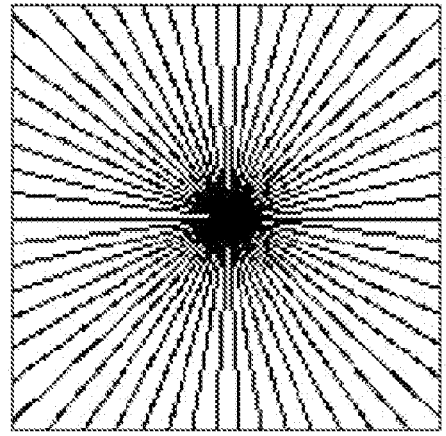
Figure 17C:
Figure 17D:

FIGS. 17A-17D show examples of images associated with an image reconstruction process for an axial 0.35 T MR image of the pelvis at the level of the prostate. FIG. 17A shows the original baseline image. FIG. 17B shows the sparse radial pattern used for sampling of the K-space of the image shown in FIG. 17A using 29 trajectories to produce the images shown in FIGS. 17C and 17D. FIG. 17C shows the resulting image using the disclosed algorithm with the l=0 norm, and FIG. 17D shows the resulting image using the disclosed algorithm with the l=2 norm. The images in FIGS. 17C and 17D have relative errors of 6.62% and 5.75%, respectively.

Figure 18A:
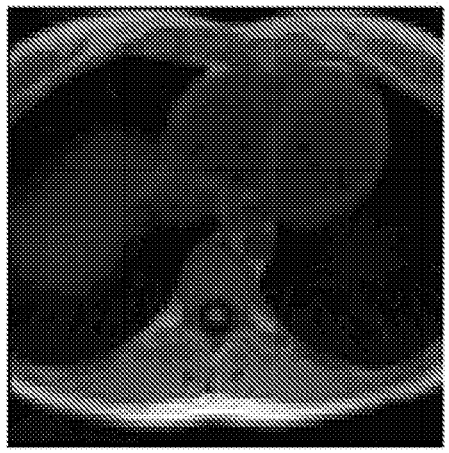
Figure 18B:
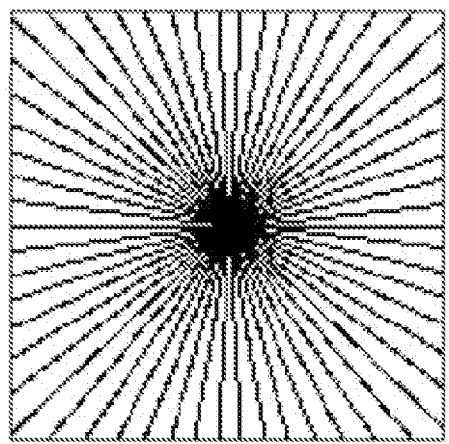
Figure 18C:
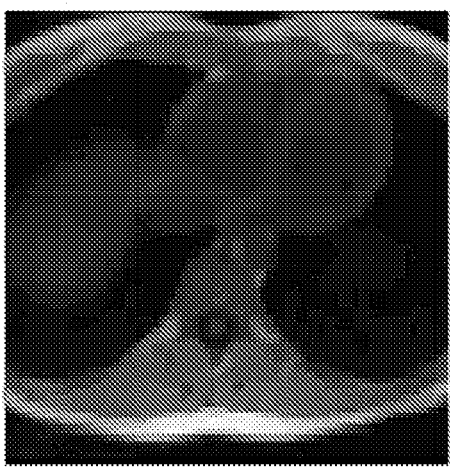
Figure 18D:
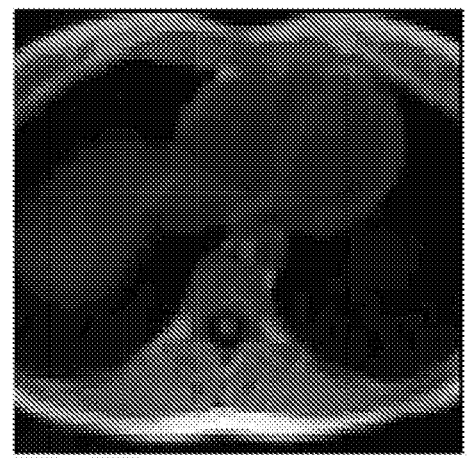

FIGS. 18A-18D show examples of images associated with an image reconstruction process for an axial 0.35 T MR image of the thorax at the level of the lung. FIG. 18A shows the original baseline image. FIG. 18B shows the sparse radial pattern used for sampling of the K-space of the image shown in FIG. 18A using 29 trajectories to produce the images shown in FIGS. 18C and 18D. FIG. 18C shows the resulting image using the disclosed algorithm with the l=0 norm, and FIG. 18D shows the resulting image using the disclosed algorithm with the l=2 norm. The images in FIGS. 18C and 18D have relative errors of 8.57% and 6.43%, respectively.

Figure 19A:
Figure 19B:
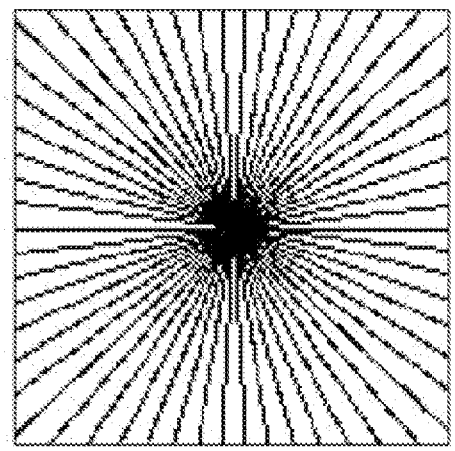
Figure 19C:
Figure 19D:

FIGS. 19A-19D show examples of images associated with an image reconstruction process for an axial 0.35 T MR image of the brain. FIG. 19A shows the original baseline image. FIG. 19B shows the sparse radial pattern used for sampling of the K-space of the image shown in FIG. 19A using 29 trajectories to produce the images shown in FIGS. 19C and 19D. FIG. 19C shows the resulting image using the disclosed algorithm with the l=0 norm, and FIG. 19D shows the resulting image using the disclosed algorithm with the l=2 norm. The images in FIGS. 19C and 19D have relative errors of 9.70% and 8.30%, respectively.

Next, FIGS. 20A-22D show examples that include the use of a half Fourier technique where a phase correction is determined by methods known in the art so that one can reconstruct a real, i.e. not complex image. The reconstruction images shown in FIGS. 20C, 20D, 21C, 21D, 22C, 22D, 23C, and 23D were produced using sparse radial sampling of K-Space covering just less than 25% of the domain, demonstrating an increase in image acquisition speed of just greater than a factor of four.

Figure 20A:
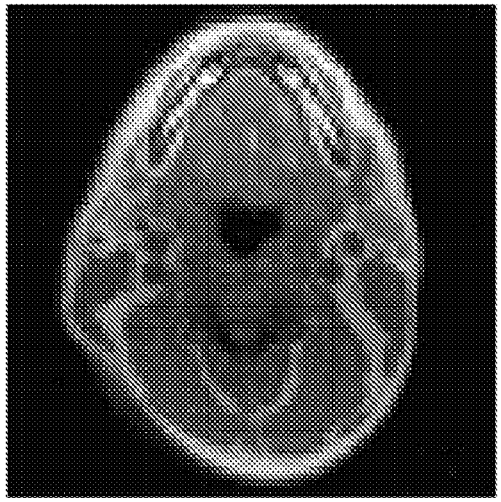
FIGS. 20A-22D show sets of images for comparison of an original image to images reconstructed using different reconstruction techniques and an illustrated k-space sparse radial sampling pattern.
Figure 20B:
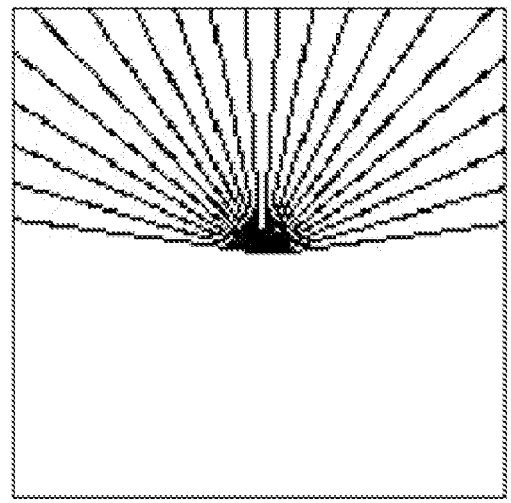
Figure 20C:
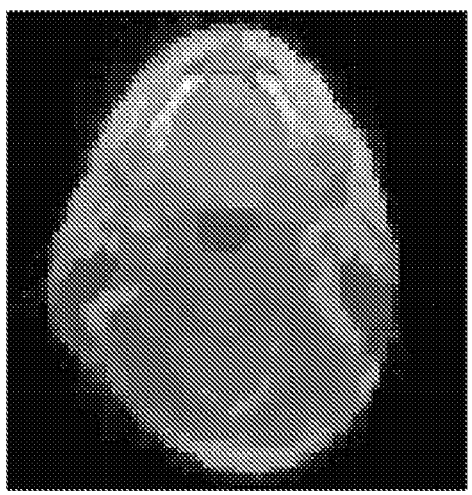
Figure 20D:
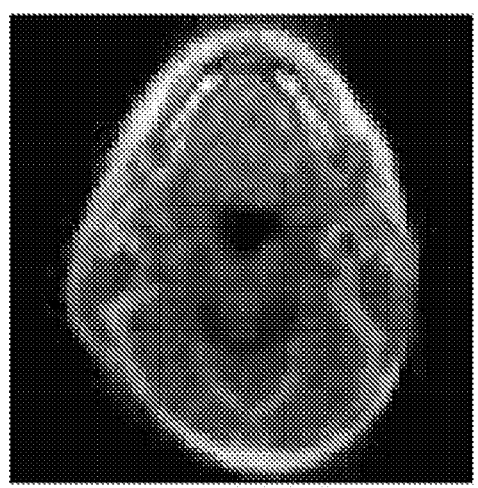

FIGS. 20A-20D show examples of images associated with an image reconstruction process for an axial 0.35 T MR image of the head and neck employing a half Fourier technique. FIG. 20A shows the original baseline image. FIG. 20B shows the sparse radial pattern used for sampling of the K-space of the image shown in FIG. 20A using 22 trajectories through half of K-space to produce the images shown in FIGS. 20C and 20D. FIG. 20C shows the resulting image using the disclosed algorithm with the l=0 norm, and FIG. 20D shows the resulting image using the disclosed algorithm with the l=2 norm. The images in FIGS. 20C and 20D have relative errors of 36.80% and 16.05%, respectively. Thus, the l=2 norm provided for better reconstruction when combined with a partial Fourier technique.

Figure 21A:
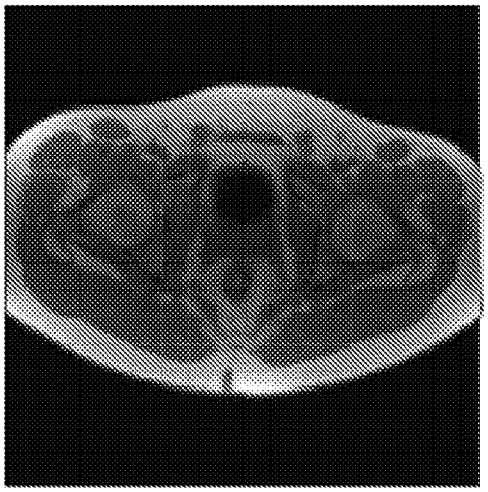
Figure 21B:
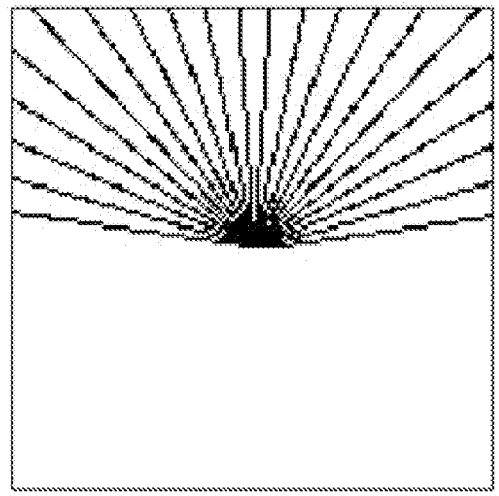
Figure 21C:
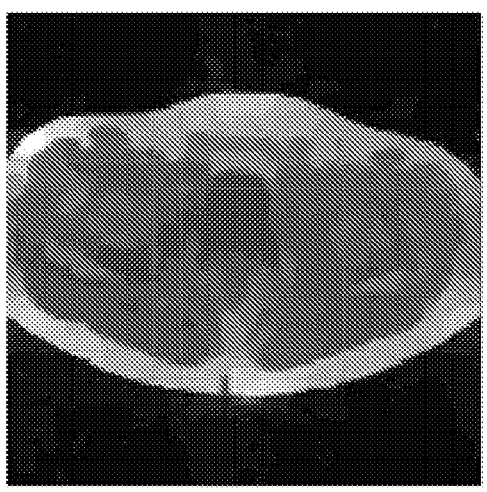
Figure 21D:
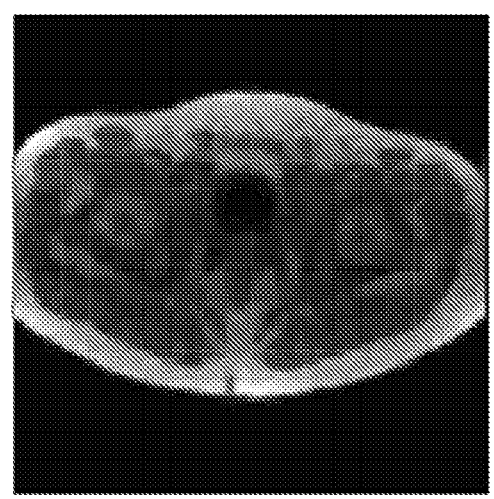

FIGS. 21A-21D show examples of images associated with an image reconstruction process for an axial 0.35 T MR image of the pelvis at the level of the prostate employing a half Fourier technique. FIG. 21A shows the original baseline image. FIG. 21B shows the sparse radial pattern used for sampling of K-space using 22 trajectories through half of the K-space of the image shown in FIG. 21A to produce the images shown in FIGS. 21C and 21D. FIG. 21C shows the resulting image using the disclosed algorithm with the l=0 norm, and FIG. 21D shows the resulting image using the disclosed algorithm with the l=2 norm. The images in FIGS. 21C and 21D have relative errors of 28.58% and 10.31%, respectively. Thus, the l=2 norm again provided for better reconstruction when combined with a partial Fourier technique.

Figure 22A:
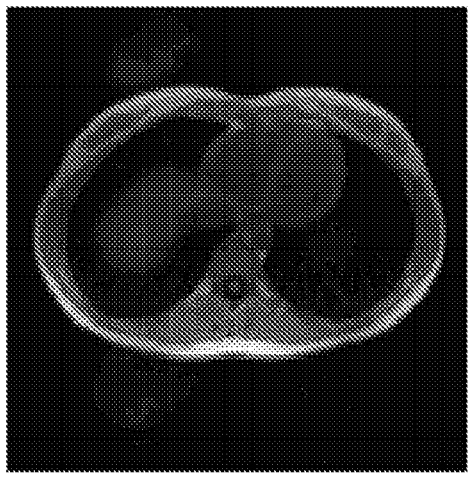
Figure 22B:
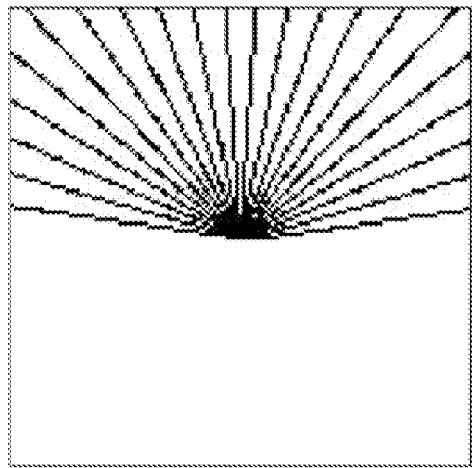
Figure 22C:
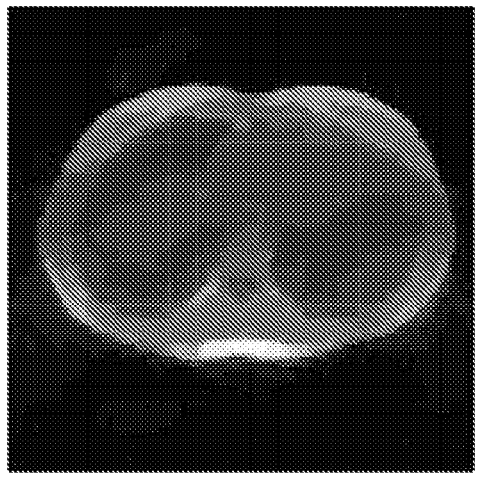
Figure 22D:
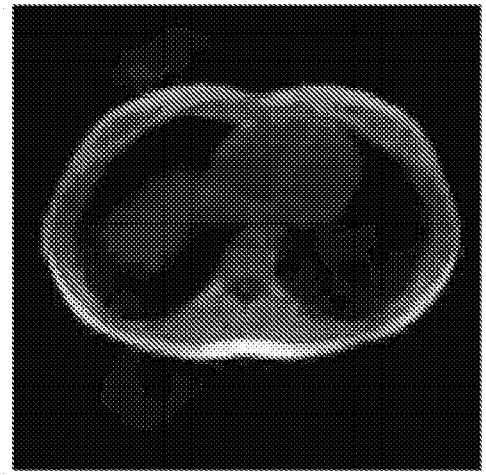

FIGS. 22A-22D show examples of images associated with an image reconstruction process for an axial 0.35 T MR image of the thorax at the level of the lung employing a half Fourier technique. FIG. 22A shows the original baseline image. FIG. 22B shows the sparse radial pattern used for sampling of K-space using 22 trajectories through half of the K-space of the image shown in FIG. 22A to produce the images shown in FIGS. 22C and 22D. FIG. 22C shows the resulting image using the disclosed algorithm with the l=0 norm, and FIG. 22D shows the resulting image using the disclosed algorithm with the l=2 norm. The images in FIGS. 22C and 22D have relative errors of 45.62% and 11.75%, respectively.

The weighted $l_2$ norm provides the best reconstruction when combined with a partial Fourier technique. Both techniques produce a reconstructed object that resembles the original object, but the $l_2$ norm has superior performance in preserving contrast and not penalizing large discontinuities. The homotopic relaxation in the $l_0$ norm appears to have trouble converging and is better suited to sparse sampling of the full K Space.

In general, the presently disclosed reconstruction process can work on the reconstruction of complex or real objects. Measured data typically provides information that is consistent with a complex object. In reality, imaged objects are real and a phase shift exists that can modify the measured data so that it is consistent with a real object. The presently disclosed algorithms typically perform better when reconstructing a real object. Known methods exist in the art for determining the phase factors from measured data consistent with complex objects. Both radial and spiral trajectories that pass through the origin of K-Space can provide conjugate symmetric K-Space data (i.e., $K(\bar{p})=-K^*(-\bar{p})$) that can be used to determine or estimate the phase map for making the measured object consistent with a real object.

Presently disclosed image reconstruction techniques provide a process for accelerating image acquisition without requiring additional acquisition electronics channels, as is the case for parallel imaging techniques in MR imaging. In contrast to parallel imaging techniques, the present methods also demonstrated superior image fidelity with less artifacts and better signal to noise properties at similar accelerations. Under even ideal conditions, the image signal to noise is approximately a factor of 2 better.

Figure 23A:
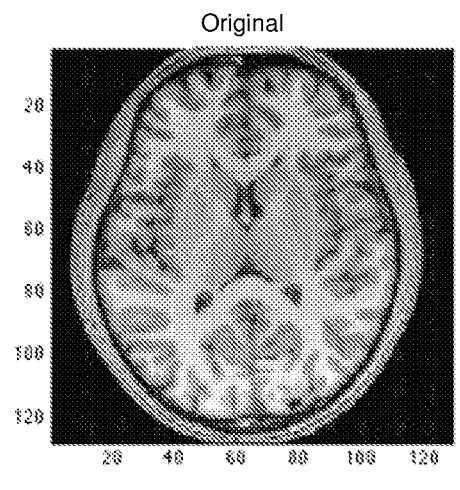
FIGS. 23A-23D show sets of images for comparison of an original image to images reconstructed using different reconstruction techniques and an illustrated k-space sparse radial sampling pattern.
Figure 23B:
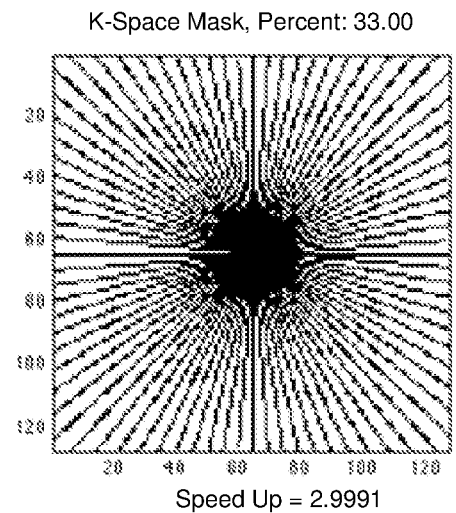
Figure 23C:
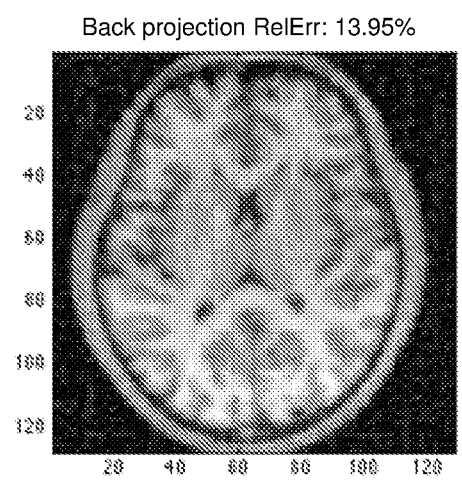
Figure 23D:
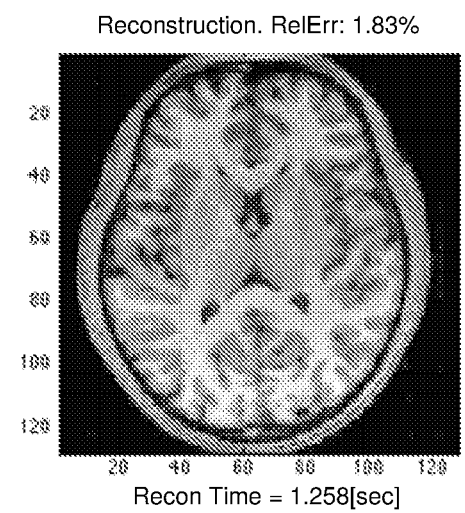

For example, FIGS. 23A-23D show examples of images associated with an image reconstruction process for an image of the brain from K space of simulated 8-channel coil combined into an average signal, with an approximate acceleration factor of R=3. FIG. 23A shows the original baseline image. FIG. 23B shows the sparse radial pattern used for sampling of 33% of the K-space of the image shown in FIG. 23A to produce the image shown in FIG. 23D. FIG. 23C shows the resulting image using the backprojection technique, which has a relative error of 13.95%. FIG. 23D shows the resulting image using the disclosed algorithm, which has a lower relative error of 1.83% and a signal to noise ratio of 11.1.

Figure 24A:
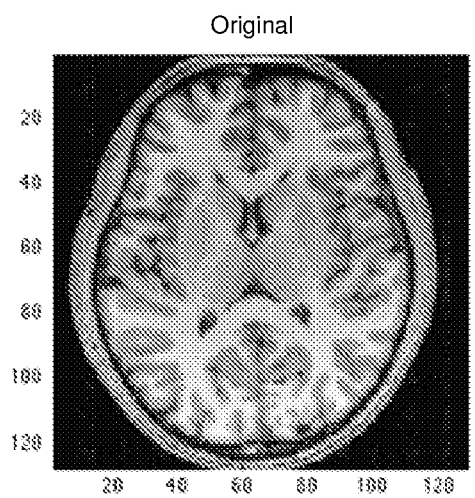
FIGS. 24A-24D show sets of images for comparison of an original image to images reconstructed using different reconstruction techniques and an illustrated k-space sparse GRAPPA sampling pattern.
Figure 24B:
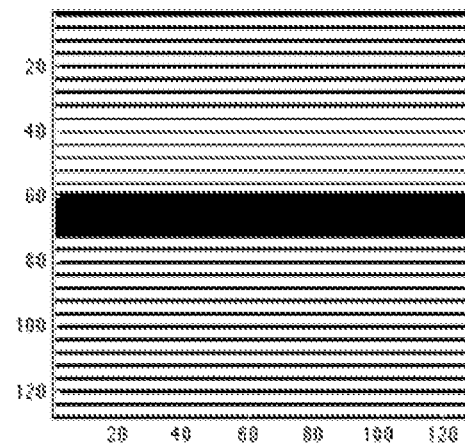
Figure 24C:
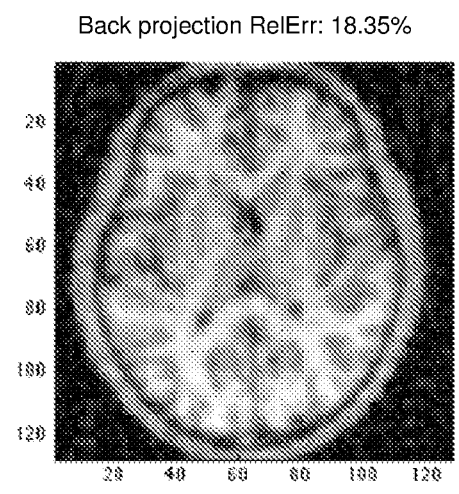
Figure 24D:
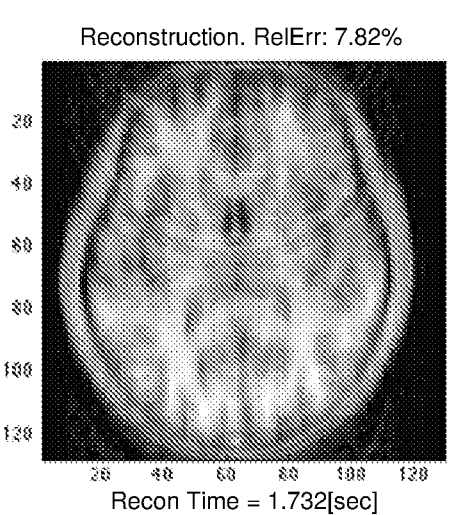

FIGS. 24A-24D show examples of images associated with an image reconstruction process for an image of the brain from K space of simulated 8-channel coil using GRAPPA (GeneRalized Autocalibrating Partially Parallel Acquisitions) with four autocalibration signal (ACS) lines, with an approximate acceleration factor of R=3, i.e., 33% of K-space including ACS lines. FIG. 24A shows the original baseline image. FIG. 24B shows the sparse pattern of parallel lines used for sampling K-space to produce the image shown in FIG. 24D. FIG. 24C shows the resulting image using the backprojection technique, which has a relative error of 18.35%. FIG. 24D shows the resulting image using the disclosed algorithm, which has a lower relative error of 7.82% and a signal to noise ratio of 11.1.

Thus, the present disclosure provides a general model for image reconstruction from incomplete measured frequency samples by performing a multicriteria optimization of a priori physical attributes of the imaged object and least squares agreement with the measured frequency samples. The a priori physical attributes which are known to exist in the object can be optimized via an l=0, l=1, or l=2 norm of a discretization of the total variation (TV) of the image intensities over the variation of the image to produce an image that is piece-wise constant, but at the same time does not penalize large discontinuities via a norm weighting factor $M_l$. The least squares term contains a weighting factor, $\eta_p$, to allow for estimates of the importance of each measured point that can be adjusted with frequency and time of acquisition.

The present disclosure provides an algorithm for rapid numerical solution of the model, which depends on the choice of norm (l=0, l=1, or l=2). For the l=0 norm, the solution can be approximated by the homotopic minimization of the l=0 quasi-norm. The present algorithms can explicitly include the reconstruction of imaginary objects as encountered in MRI. The least squares term can be evaluated on grid or by direct sine interpolation.

Also disclosed are K-space sampling patterns and strategies to improve reconstruction fidelity. The present disclosure includes 2D and 3D K-Space sparse sampling patterns. Radial sparse K-Space patterns can be used to reconstruct any type of tomographic image. Cartesian sparse K-Space patterns can be used to reconstruct a variety of images, for example MR images. Spiral patterns can be arranged uniformly or stochastically in K-Space to reconstruct a variety of images, for example MR images. Denser sampling can be performed at the center of K-Space to improve image quality. In repeated or ciné acquisition, one can change or permute the patterns with each acquisition. For some types of image reconstruction, e.g., MR image reconstruction, spiral patterns can be combined with uniformly or stochastically arranged Cartesian or Radial trajectories.

Figure 25:
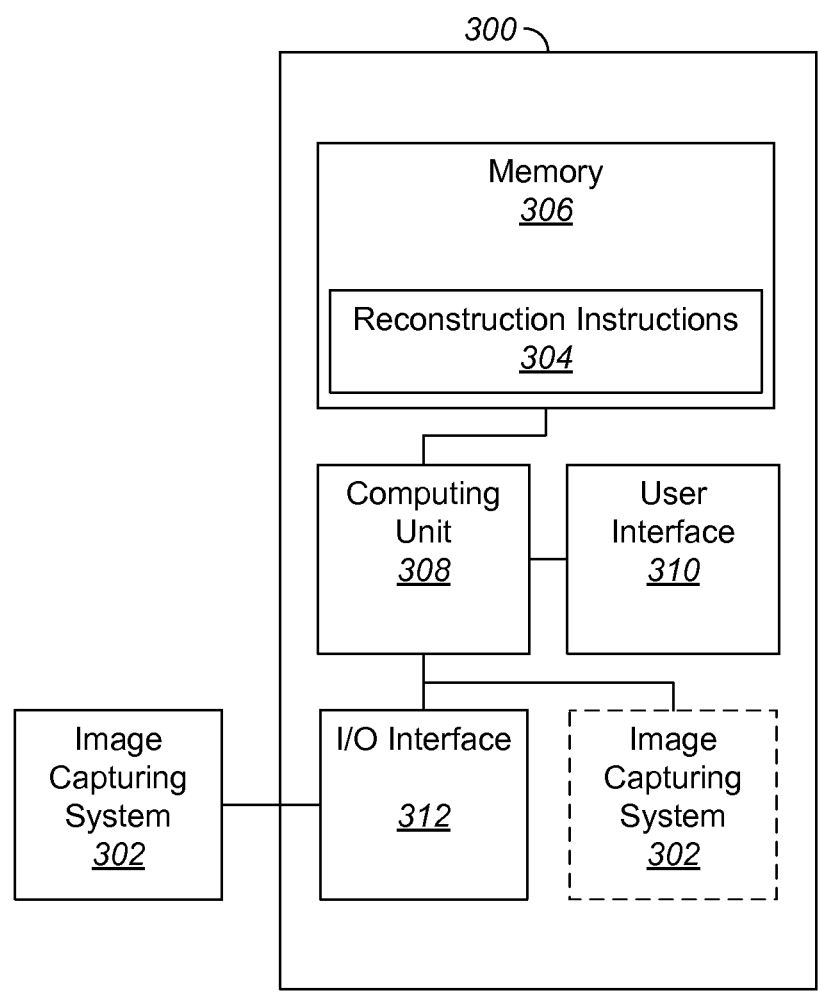
FIG. 25 shows a block diagram of an embodiment of an imaging system.

FIG. 25 shows a block diagram of an imaging system 300. The image reconstruction algorithms, such as those illustrated in FIGS. 1 and 2, in combination with K-space sampling patterns, such as those illustrated in FIGS. 3-5 and 12B-24B, can be used to produce an image or series of images from K-space data generated by an image capturing system 302. Image capturing system 302 can be integral with the imaging system 300 or can be separate from the image capturing system 302. The image capturing system 302 can include an apparatus that is capable of acquiring images, which can include 2D and/or 3D images, and providing the corresponding K-space data of the acquired images. Examples of conventional systems that can be used as the image capturing system 302, or components of which can be used as components of the image capturing system 302, include, but are not limited to, systems for Computed tomography (CT or CATscan) using X-Ray or Gamma-Ray tomography, Confocal laser scanning microscopy (LSCM), Cryo-electron tomography (Cryo-ET), Electrical capacitance tomography (ECT), Electrical resistivity tomography (ERT), Electrical impedance tomography (EM), Functional magnetic resonance imaging (fMRI), Magnetic induction tomography (MIT), Magnetic resonance imaging (MRI) (formerly known as magnetic resonance tomography (MRT) or nuclear magnetic resonance tomography), Neutron tomography, Optical coherence tomography (OCT), Optical projection tomography (OPT), Process tomography (PT), Positron emission tomography (PET), Positron emission tomography-computed tomography (PET-CT), Quantum tomography, Single photon emission computed tomography (SPECT), Seismic tomography, Ultrasound Imaging (US), Ultrasound assisted optical tomography (UAOT), Ultrasound transmission tomography, Photoacoustic tomography (PAT), also known as Optoacoustic Tomography (OAT) or Thermoacoustic Tomography (TAT), and Zeeman-Doppler imaging.

The imaging system 300 includes instructions 304 for reconstruction of an image. The instructions 304 can include software instructions stored in a memory 306. The memory 306 where the instructions 304 are stored can include removable memory, for example a compact disc (CD) or digital video disc (DVD), and/or fixed memory, for example a read-only memory (ROM) chip or a hard drive. While the memory 306 is shown to be local to the imaging system 300, alternatively some or all of the memory 306 storing the instructions 304 can be external to the imaging system 300, for example in the form of an external hard drive or a remote system that is connected to the imaging system 300 via a network and/or the Internet.

The imaging system 300 includes a computing unit 308, which can be a central processing unit (CPU) or a Graphic Processing Unit (GPU), a user interface 310, and an input/output (I/O) interface 312. The computing unit 308 is operable for performing operations according to the instructions 302. The computing unit 308 can include one or more processors that can be local to the imaging system 300 and/or distributed among one or more local and/or remotely networked computer systems. The computing unit 308 can also control operations of one or more of the user interface 310, input/output (I/O) interface 312, and/or the image capturing system 302. The user interface 310 can include devices for output information to a user, for example a display and/or printer, and devices for receiving inputs from a user, for example a keyboard, touchscreen, and/or mouse. The I/O interface 312 can include one or more communication ports, for example a universal serial bus (USB) port, and/or networking devices, for example network adapter and/or modem, for allowing for communications with external devices, which can include an external image capturing system 302.

For example, some embodiments of the imaging system 300 can include an MRI system that is capable of substantially simultaneous imaging for treatment monitoring, control, and validation, for example as disclosed in U.S. Patent Application Publication 2005/0197564 to Dempsey, which is hereby incorporated by reference. Combination of the disclosed techniques with image guided radiation therapy can produce faster images for patient set-up. Also, combination of the disclosed techniques with image guided radiation therapy can produce images with less ionizing radiation dose to the patient for MV and X-Ray CT.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A non-transitory computer-readable medium containing instructions that configure a processor to perform operations comprising:
    acquiring a k-space data set of an imaged object, the k-space data set generated by a tomographic imaging system;
    collecting a portion of the k-space data set by rotating a data collecting pattern around an axis in one or more trajectory planes of the data collecting pattern; and
    reconstructing an image from the collected portion of the k-space data set.

2. The non-transitory computer-readable medium of claim 1, wherein the data collecting pattern includes a sampling line having a plurality of sampling points, and the plurality of sampling points each have a weighting factor.

3. The non-transitory computer-readable medium of claim 2, wherein the weighting factor is higher at the sampling points near a center of the k-space data set.

4. The non-transitory computer-readable medium of claim 2, wherein the weighting factor is higher at the sampling points near expected ridges in the k-space data set.

5. The non-transitory computer-readable medium of claim 1, wherein the reconstructing of the image is performed with a model that includes a weighting factor representative of a priori attributes of the imaged object.

6. A non-transitory computer-readable medium containing instructions that configure a processor to perform operations comprising:
    acquiring a k-space data set of an imaged object, the k-space data set generated by at least one of a magnetic resonance imaging system, a computed tomography system, or a positron emission tomography system;
    collecting a portion of the k-space data set by rotating a data collecting pattern around an axis in one or more trajectory planes of the data collecting pattern; and
    reconstructing an image from the collected portion of the k-space data set.

7. The non-transitory computer-readable medium of claim 6, wherein the data collecting pattern includes a sampling line having a plurality of sampling points, and the plurality of sampling points each have a weighting factor.

8. The non-transitory computer-readable medium of claim 7, wherein the weighting factor is higher at the sampling points near a center of the k-space data set.

9. The non-transitory computer-readable medium of claim 7, wherein the weighting factor is higher at the sampling points near expected ridges in the k-space data set.

10. The non-transitory computer-readable medium of claim 6, wherein the reconstructing of the image is performed with a model that includes a weighting factor representative of a priori attributes of the imaged object.

11. A non-transitory computer-readable medium containing instructions that configure a processor to perform operations comprising:
    acquiring a k-space data set of an imaged object, the k-space data set generated by a tomographic imaging system;
    collecting a portion of the k-space data set by rotating a data collecting pattern to sample a 3-D k-space; and
    reconstructing an image from the collected portion of the k-space data set.

12. The non-transitory computer-readable medium of claim 11, wherein the data collecting pattern includes a sampling line having a plurality of sampling points, and the plurality of sampling points each have a weighting factor.

13. The non-transitory computer-readable medium of claim 12, wherein the weighting factor is higher at the sampling points near a center of the k-space data set.

14. The non-transitory computer-readable medium of claim 12, wherein the weighting factor is higher at the sampling points near expected ridges in the k-space data set.

15. The non-transitory computer-readable medium of claim 11, wherein the reconstructing of the image is performed with a model that includes a weighting factor representative of a priori attributes of the imaged object.

16. The non-transitory computer-readable medium of claim 11, wherein the reconstructing of the image is performed with a model that includes updating a value of a norm weighting factor preventing penalizing of discontinuities in the reconstructed image.

17. The non-transitory computer-readable medium of claim 11, wherein the reconstructing of the image is performed with a model that includes a weighting factor representative of expected noise properties within the k-space data set.

18. The non-transitory computer-readable medium of claim 11, wherein the collecting comprising perturbing a portion of the data collecting pattern in or out of a sampling plane.

19. The non-transitory computer-readable medium of claim 11, the collecting comprising introducing a pseudo-random shift into one or more trajectories of the data collecting pattern.

* * * * *